US 9,183,893 B2

(12) United States Patent
Kanamori et al.

(10) Patent No.: US 9,183,893 B2
(45) Date of Patent: Nov. 10, 2015

(54) SEMICONDUCTOR MEMORY DEVICE

(71) Applicants: Kohji Kanamori, Seoul (KR); Youngwoo Park, Seoul (KR); Jintaek Park, Hwaseong-si (KR); Kwang Soo Seol, Yongin-si (KR); Jaeduk Lee, Seongnam-si (KR)

(72) Inventors: Kohji Kanamori, Seoul (KR); Youngwoo Park, Seoul (KR); Jintaek Park, Hwaseong-si (KR); Kwang Soo Seol, Yongin-si (KR); Jaeduk Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 132 days.

(21) Appl. No.: 14/037,547

(22) Filed: Sep. 26, 2013

(65) Prior Publication Data
US 2014/0085961 A1 Mar. 27, 2014

(30) Foreign Application Priority Data

Sep. 26, 2012 (KR) .................. 10-2012-0107192

(51) Int. Cl.
*G11C 5/06* (2006.01)
*G11C 13/00* (2006.01)
(Continued)

(52) U.S. Cl.
CPC *G11C 5/06* (2013.01); *G11C 5/063* (2013.01); *G11C 13/0002* (2013.01); *G11C 13/0023* (2013.01); *H01L 27/222* (2013.01); *H01L 27/249* (2013.01); *H01L 45/04* (2013.01); *H01L 45/06* (2013.01); *H01L 45/1226* (2013.01); *H01L 45/143* (2013.01); *H01L 45/144* (2013.01); *H01L 45/146* (2013.01); *H01L 45/147* (2013.01); *G11C 2213/73* (2013.01)

(58) Field of Classification Search
CPC ...... G11C 5/06; G11C 13/0002; G11C 5/063; G11C 13/0023; G11C 2213/73; H01L 45/04; H01L 45/06; H01L 45/1226; H01L 45/143; H01L 45/144; H01L 45/146; H01L 45/147; H01L 27/222; H01L 27/249
USPC .............................................. 365/72, 63, 148
See application file for complete search history.

(56) References Cited

U.S. PATENT DOCUMENTS 7,983,065 B2   7/2011   Samachisa
7,983,084 B2   7/2011   Tokiwa et al.
(Continued)

FOREIGN PATENT DOCUMENTS

KR       20100069391 A     6/2010
KR       20110005120 A     1/2011
(Continued)

*Primary Examiner* — Toan Le
(74) *Attorney, Agent, or Firm* — Harness, Dickey & Pierce, P.L.C.

(57) ABSTRACT

According to example embodiments of inventive concepts, a semiconductor memory devices includes: a plurality of memory blocks that each include a plurality of stack structures, global bit lines connected in common to the plurality of memory blocks, block selection lines configured to control electrical connect between the global bit lines and one of the plurality of memory blocks, and vertical selection lines configured to control electrical connected between the global bit lines and one of the plurality of stack structures. Each of the plurality of stack structures includes a plurality of local bit lines, first vertical word lines and second vertical word lines crossing first sidewalls and second sidewalls respectfully of the plurality of stack structures, first variable resistive elements between the plurality of stack structures and the first vertical word lines, and second variable resistive elements between the plurality of stack structures and the second vertical word lines.

20 Claims, 27 Drawing Sheets

(51) Int. Cl.
  *H01L 45/00* (2006.01)
  *H01L 27/22* (2006.01)
  *H01L 27/24* (2006.01)

(56) References Cited

U.S. PATENT DOCUMENTS

| 8,102,711 | B2 | 1/2012 | Maejima |
| 2010/0097858 | A1 | 4/2010 | Tokiwa et al. |
| 2010/0226195 | A1 | 9/2010 | Lue |
| 2010/0259960 | A1 | 10/2010 | Samachisa |
| 2011/0058418 | A1 | 3/2011 | Choi et al. |
| 2011/0069550 | A1 | 3/2011 | Maejima |
| 2011/0241077 | A1 | 10/2011 | Lung |
| 2011/0297912 | A1* | 12/2011 | Samachisa et al. ............... 257/5 |
| 2012/0117316 | A1 | 5/2012 | Park et al. |
| 2012/0147644 | A1* | 6/2012 | Scheuerlein .................... 365/51 |
| 2012/0147650 | A1* | 6/2012 | Samachisa et al. ............. 365/51 |

FOREIGN PATENT DOCUMENTS

| KR | 20110095646 A | 8/2011 |
| KR | 20110136642 A | 12/2011 |

* cited by examiner

SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2012-0107192, filed on Sep. 26, 2012, the entire disclosure of which is incorporated by reference herein.

BACKGROUND

Example embodiments of inventive concepts relate to a semiconductor memory device and, more particularly, to a semiconductor memory device including three-dimensionally arranged memory cells.

Semiconductor memory devices may store digital data. Highly integrated semiconductor memory devices have been increasingly demanded with the development of an electronic industry and a semiconductor industry. For example, semiconductor memory devices capable of storing more data have been demanded with the development of portable electronic products such as a laptop computer, a portable phone, a digital camera and/or a MP3 player.

Generally, the minimum (or desired) feature size of fine patterns in semiconductor devices may be reduced for high integration of the semiconductor memory devices. The minimum (or desired) feature size of the fine patterns may be two-dimensionally reduced to integrate more memory cells in a limited area. However, there are limitations in reducing the minimum (or desired) feature size of the fine patterns by various factors (e.g., limitation of a photolithography process). Thus, various research has been conducted for other methods for highly integrating the semiconductor memory devices.

SUMMARY

Example embodiments of inventive concepts relate to three-dimensional semiconductor memory devices with improved integration and reliability.

According to example embodiments of inventive concepts, a semiconductor memory device may include: a substrate; a plurality of memory blocks on the substrate, each of the plurality of memory blocks including a plurality of stack structures including a plurality of local bit lines stacked on the substrate, first vertical word lines crossing first sidewalls of the plurality of stack structures, second vertical word lines crossing second sidewalls of the plurality of stack structures, first variable resistive elements between the plurality of stack structures and the first vertical word lines, and second variable resistive elements between the plurality of stack structures and the second vertical word lines; global bit lines connected in common to the plurality of memory blocks; block selection lines configured to control electrical connection between the global bit lines and one of the plurality of memory blocks; and vertical selection lines on the substrate, the vertical selection lines configured to control electrical connection between the global bit lines one of the plurality of stack structures.

According to example embodiments of inventive concepts, a semiconductor memory device may include: a substrate including a cell array region and a peripheral circuit region; a plurality of vertical cell groups disposed on cell array region of the substrate, each of the plurality of vertical cell groups including a plurality of local bit lines stacked on the substrate, first vertical word lines crossing first sidewalls of the local bit lines, second vertical word lines crossing second sidewalls of the local bit lines, first memory elements between the plurality of local bit lines and the first vertical word lines, and second memory elements between the plurality of local bit lines and the second vertical word lines; vertical cell group selection parts on the peripheral circuit region of the substrate, the vertical cell group selection parts connected to the plurality of vertical cell groups, respectively; and a memory block selection part on the peripheral circuit region of the substrate, the memory block selection part connected in common to the vertical cell group selection parts.

According to example embodiments of inventive concepts, a semiconductor memory device may include: a substrate; a plurality of memory blocks; and a control circuit connected to the plurality of memory blocks. Each one of the plurality of memory blocks may include a memory block selection part connected to a plurality of vertical cell groups through a plurality of a vertical cell group selection parts. Each one of the plurality of vertical cell groups may include: a plurality of local bit lines that are stacked on top of each other; a plurality of first vertical word lines perpendicular to the substrate; a plurality of second vertical word lines perpendicular to the substrate; and a plurality of first memory cells paired one-to-one with a plurality of second memory cells and arranged in rows and columns. The plurality of first and second memory cells in a same row may be electrically connected in common to one of plurality of local bit lines that extends between the plurality of the first and second memory cells of the same row. The plurality of first and second memory cells in a same column may be arranged so one of the plurality of first vertical word lines is electrically connected to the plurality of first memory cells of the same column and one of the plurality of second vertical word lines is electrically connected to the plurality of second memory cells of the same column. The control circuit may be configured to select one of the plurality of first memory cells and the plurality of second memory cells independently in a selected of the plurality of vertical cell groups of a selected one of the plurality of memory blocks.

BRIEF DESCRIPTION OF THE DRAWINGS

Example embodiments of inventive concepts will become more apparent from the more particular description of non-limiting embodiments of inventive concepts, as illustrated in the accompanying drawings. The drawings are not necessarily to scale, emphasis instead being placed upon illustrating the principles of inventive concepts. In the drawings.

DETAILED DESCRIPTION OF THE EMBODIMENTS

Figure 1:
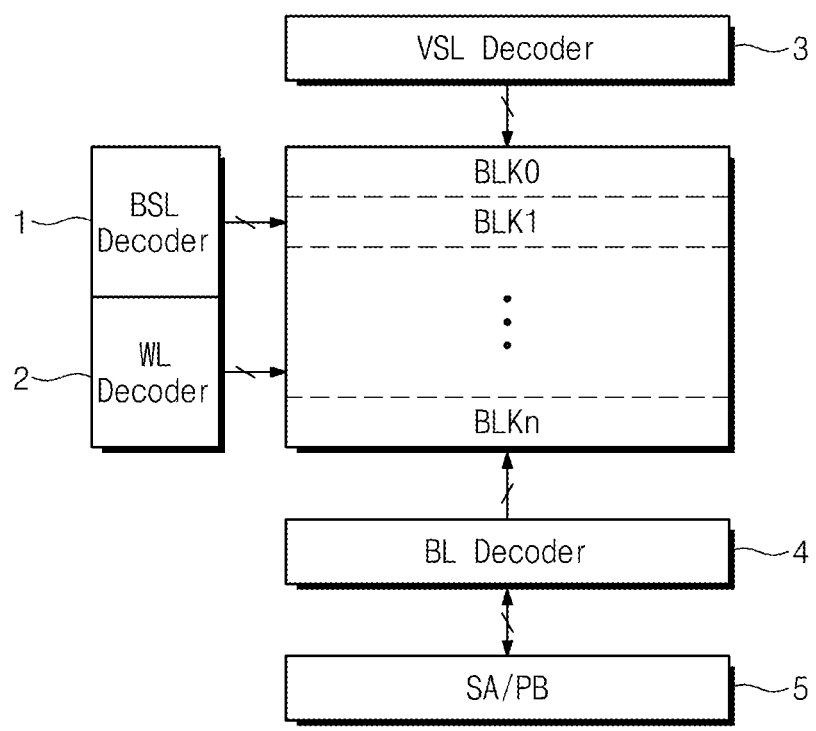
FIG. 1 is a schematic block diagram illustrating a semiconductor memory device according to example embodiments of inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Similarly, it will be understood that when an element such as a layer, region or substrate is referred to as being "on" another element, it can be directly on the other element or intervening elements may be present. In contrast, the term "directly" means that there are no intervening elements. Other words used to describe the relationship between elements or layers should be interpreted in a like fashion (e.g., "between" versus "directly between," "adjacent" versus "directly adjacent"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

FIG. 1 is a schematic block diagram illustrating a semiconductor memory device according to example embodiments of inventive concepts.

Referring to FIG. 1, a semiconductor memory device may include a plurality of memory blocks BLK0 to BLKn, a block selection line decoder 1, a word line decoder 2, a vertical selection line decoder 3, a bit line decoder 4, a sense amplifier-page buffer 5, and a control circuit (not illustrated).

Each of the memory blocks BLK0 to BLKn may include a memory cell array including three-dimensionally arranged memory cells, a memory block selection part, and a vertical cell group selection part.

The block selection line decoder 1 is connected in common to the plurality of memory blocks BLK0 to BLKn. Additionally, the block selection line decoder 1 provides a block selection signal to the memory blocks BLK0 to BLKn to select one of the memory blocks BLK0 to BLKn.

The word line decoder 2 decodes an address signal inputted from an external system to select one of word lines. The word line decoder 2 is connected in common to the plurality of memory blocks BLK0 to BLKn. The word line decoder 2 provides data to the word lines of the memory block selected by the block selection signal.

The vertical selection line decoder 3 is connected in common to the plurality of memory blocks BLK0 to BLKn. The vertical selection line decoder 3 provides a vertical cell group selection signal to the selected memory block to select one of vertical selection lines. Thus, one of vertical cell groups may be selected in the selected memory block.

The bit line decoder 4 decodes an address signal inputted from an external system to select one of global bit lines. The bit line decoder 4 is connected in common to the plurality of memory blocks BLK0 to BLKn. The bit line decoder 4 provides data to local bit lines in the memory block selected by the block selection signal.

The sense amplifier-page buffer 5 is connected to the memory cell array through the global bit lines. The sense amplifier-page buffer 5 is configured to exchange data with an external system. The sense amplifier-page buffer 5 may be operated in response to a control signal of a control logic (not illustrated).

The control circuit (not illustrated) controls operations of the block selection line decoder 1, the word line decoder 2, the vertical selection line decoder 3, and the bit line decoder 4.

Figure 2:
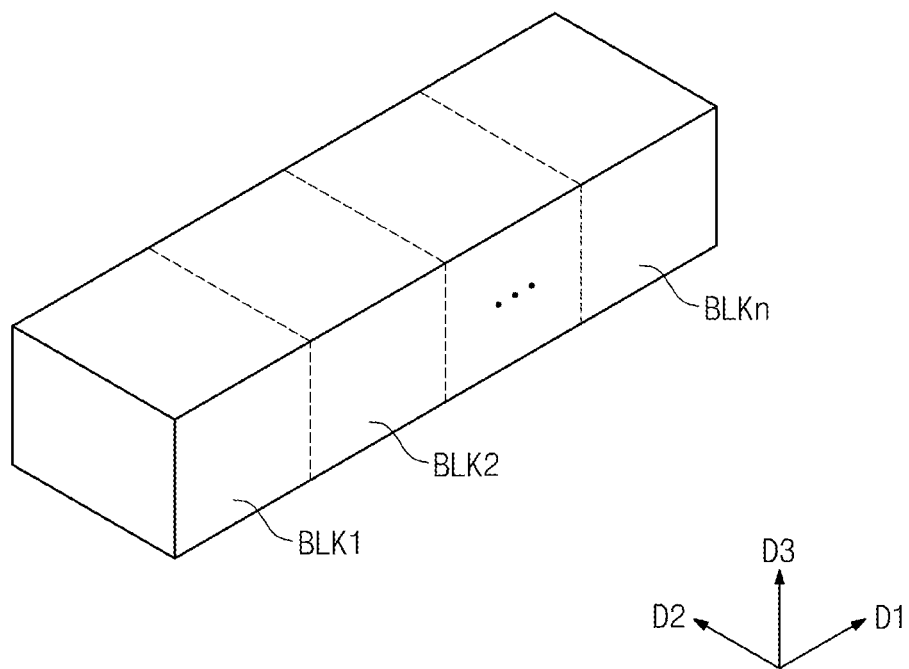
FIG. 2 is a schematic perspective view illustrating memory blocks of a semiconductor memory device according to example embodiments of inventive concepts.

FIG. 2 is a schematic perspective view illustrating memory blocks of a semiconductor memory device according to example embodiments of inventive concepts.

Referring to FIG. 2, memory blocks BLK1 to BLKn may be disposed on a plane extending in first and second directions D1 and D2. Each of the memory blocks BLK1 to BLKn may include a structure having components stacked along a third direction D3 on the plane of the first and second directions D1 and D2. Each of the memory blocks BLK1 to BLKn includes a memory cell array having a three-dimensional structure (or a vertical structure). A plurality of the memory blocks BLK1 to BLKn may share the block selection line decoder 1, the word line decoder 2, the vertical selection line decoder 3, and the bit line decoder 4 illustrated in FIG. 1.

Figure 3:
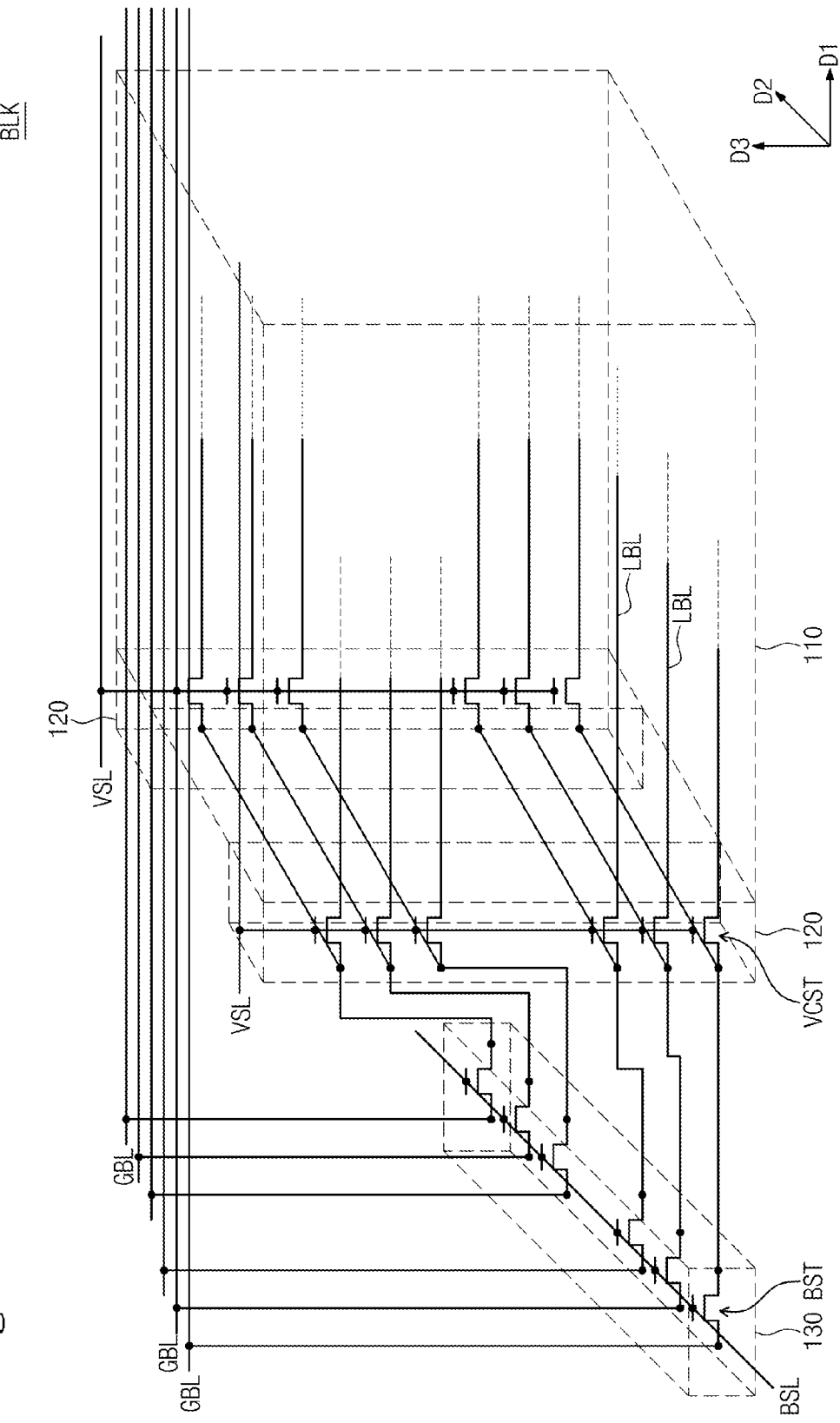
FIG. 3 is a schematic circuit diagram illustrating a memory block of a semiconductor memory device according to example embodiments of inventive concepts.
Figure 4:
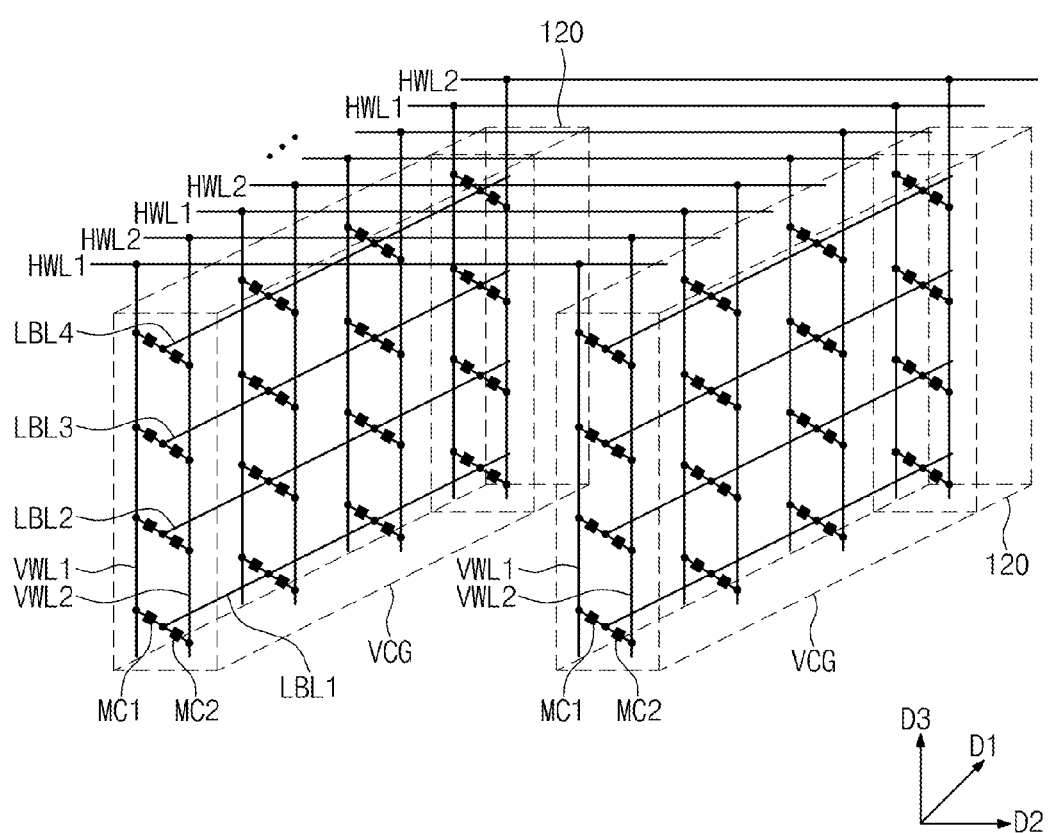
FIG. 4 is a schematic circuit diagram illustrating a memory cell array of a semiconductor memory device according to example embodiments of inventive concepts.

FIG. 3 is a schematic circuit diagram illustrating a memory block of a semiconductor memory device according to example embodiments of inventive concepts. FIG. 4 is a schematic circuit diagram illustrating a memory cell array of a semiconductor memory device according to example embodiments of inventive concepts.

Referring to FIG. 3, each memory block BLK may include a memory cell array 110, a plurality of vertical cell group selection parts 120, and a memory block selection part 130.

Referring to FIG. 4, the memory cell array 110 includes first and second vertical word lines VWL1 and VWL2, first and second horizontal word lines HWL1 and HWL2, local bit lines LBL1 to LBL4, and a plurality of memory cells MC1 and MC2. The plurality of memory cells MC1 and MC2 are three-dimensionally arranged.

According to example embodiments of inventive concepts, the memory cell array 110 may include a plurality of vertical cell groups VCG. Each of the vertical cell groups VCG includes a desired (and/or alternatively predetermined) number of memory cells. Each of the vertical cell groups VCG includes first memory cells MC1 connected between the first vertical word lines VWL1 and the local bit lines LBL1 to LBL4 and second memory cells MC2 connected between the second vertical word lines VWL2 and the local bit lines LBL1 to LBL4. The plurality of vertical cell groups VCG may be arranged along the second direction D2 and be spaced apart from each other. The first and second memory cells MC1 and MC2 may be arranged in the first direction D1 and the third direction D3 in each of the vertical cell groups VCG. In other words, the first and second memory cells MC1 and MC2 may be three-dimensionally arranged through the plurality of vertical cell groups VCG in the semiconductor memory device.

In more detail, each of the vertical cell groups VCG may include a plurality of the local bit lines LBL1 to LBL4, and a plurality of the first vertical word lines VWL1. The plurality of local bit lines LBL1 to LBL4 extend in the first direction D1 and are parallel to each other. The plurality of local bit lines LBL1 to LBL4 are spaced apart from each other in the third direction D3. The plurality of the first vertical word lines VWL1 are parallel to each other and extend in the third direction D3. The plurality of the first vertical word lines VWL1 are spaced apart from each other in the first direction D1. Additionally, each of the vertical cell groups VCG may further include a plurality of the second vertical word lines VWL2, which are parallel to each other, extend in the third direction D3, and are spaced apart from each other in the first direction D1.

In each of the vertical cell groups VCG, the local bit lines LBL1 to LBL4 may be spaced apart from each other in the third direction D3, which is perpendicular to the first and second directions D1 and D2. In each of the vertical cell groups VCG, the first vertical word lines VWL1 may be disposed at a first side of the local bit lines LBL1 to LBL4 and may be spaced apart from each other in the first direction D1. In each of the vertical cell groups VCG, the second vertical word lines VWL2 may be disposed at a second side of the local bit lines LBL1 to LBL4 and may be spaced apart from each other in the first direction D1.

In each of the vertical cell groups VCG, the first memory cells MC1 are disposed at cross points of the local bit lines LBL1 to LBL4 and the first vertical word lines VWL1, respectively, and the second memory cells MC2 are disposed at cross points of the local bit lines LBL1 to LBL4 and the second vertical word lines VWL2, respectively. The first and second memory cells MC1 and MC2 adjacent to each other may share one local bit line. The memory cell array 110 including the first and second memory cells MC1 and MC2 may be a cross point memory array, which does not require selection elements for accessing data storage elements.

According to example embodiments of inventive concepts, each of the first and second memory cells MC1 and MC2 may consist of (or include) a resistive memory element. The resistive memory element may include a material that may be reversibly switched between at least two resistance states clearly distinguished from each other by a desired (and/or alternatively predetermined) voltage applied between both ends thereof. In other words, the resistive memory element may include a material having two stable resistance stats (e.g., a high-resistance state and a low-resistance state). For example, the resistive memory element may include a perovskite compound, a transition metal oxide, and/or a phase-change material. Alternatively, the resistive memory element may include a magnetic material, a ferromagnetic material, and/or an antiferromagnetic material. However, example embodiments of inventive concepts are not limited thereto.

The first and second horizontal word lines HWL1 and HWL2 in the memory cell array 110 may extend parallel to each other in the second direction D2 and may be alternately arranged in the first direction D1. The first and second horizontal word lines HWL1 and HWL2 are spaced apart from each other. The first and second horizontal word lines HWL1 and HWL2 may be connected in common to the plurality of vertical cell groups VCG. Additionally, the first and second horizontal word lines HWL1 and HWL2 may be connected to the word line decoder 2 of FIG. 1.

Each of the first horizontal word lines HWL1 may be connected in common to a corresponding one of the first vertical word lines VWL1, which are arranged in the second direction D2 and are included in the plurality of vertical cell groups VCG, respectively. Each of the second horizontal word lines HWL2 may be connected in common to a corresponding one of the second vertical word lines VWL2, which are arranged in the second direction D2 and are included in the plurality of vertical cell groups VCG, respectively. The horizontal word lines HWL1 and HWL2 may be electrically separated from each other. Thus, the vertical word lines VWL1 and VWL2 included in one vertical cell group VCG may be electrically separated from each other.

Referring to FIGS. 3 and 4, each of the vertical cell groups VCG may be connected to each of the vertical cell group selection parts 120. In more detail, the local bit lines LBL1 to LBL4 of each of the vertical groups VCG may be respectively coupled to global bit lines GBL through the vertical cell group selection part 120 and the memory block selection part 130. The plurality of vertical cell groups VCG may share the memory block selection part 130 and the global bit lines GBL. The global bit lines GBL may extend in parallel to each other in the first direction D1. The global bit lines GBL may be connected in common to the plurality of memory blocks BLK and may be connected to the sense amplifier-page buffer 5 of FIG. 1.

As illustrated in FIG. 3, the vertical cell group selection parts 120 are disposed between the memory cell array 110 and the memory block selection part 130. In example embodiments of inventive concepts, the vertical cell group selection parts 120 may be disposed to correspond to the vertical cell groups VCG, respectively, in each of the memory blocks BLK. The vertical cell group selection parts 120 may connect the memory block selection part 130 to one of the vertical cell groups VCG. A vertical selection line VSL is connected to each of the vertical cell group selection parts 120. The vertical selection lines VSL may extend in parallel to each other in the first direction D1. The vertical selection lines VSL may be spaced apart from each other in the second direction D2. The vertical selection lines VSL may be connected in common to the plurality of memory blocks BLK and may be connected the vertical selection line decoder 4 of FIG. 1. In other words, the vertical cell group selection parts 120 may select one of the vertical cell groups VCG in response to the vertical cell group selection signal provided by the vertical selection line decoder 3.

Each of the vertical cell group selection parts 120 includes a plurality of vertical cell group selection transistors VCST. Each of the vertical cell group selection transistors VCST may be connected in series between each of block selection transistors BST and each of the local bit lines LBL1 to LBL4. Gate electrodes of the vertical cell group selection transistors VCST may be connected in common to the vertical selection line VSL.

The memory block selection part 130 is disposed between the global bit lines GBL and the vertical cell group selection parts 120. In each of the memory blocks BLK, the plurality of vertical cell group selection parts 120 share one memory block selection part 130.

The memory block selection part 130 connects the global bit lines GBL to one of the vertical cell group selection parts 120. The memory block selection part 130 includes a plurality of the block selection transistors BST which correspond to the global bit lines GBL, respectively. Each of the block selection transistors BST is connected in series to the vertical cell group selection transistor VCST. Gate electrodes of the block selection transistors BST are connected in common to a block selection line BSL. An operation of the memory block selection part 130 is controlled by the block selection line BSL connected to the block selection line decoder 1 of FIG. 1.

Figure 5:
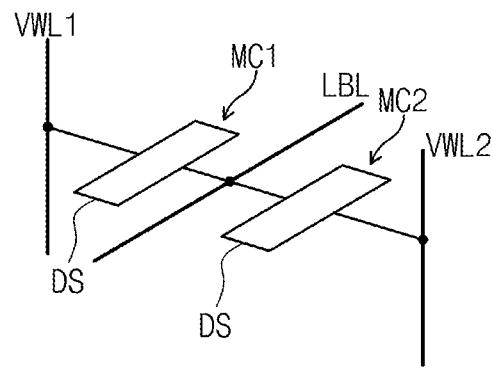
FIG. 5 is a schematic circuit diagram illustrating a portion of a memory cell array of a semiconductor memory device according to example embodiments of inventive concepts.
Figure 5:
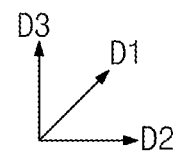
Figure 6:
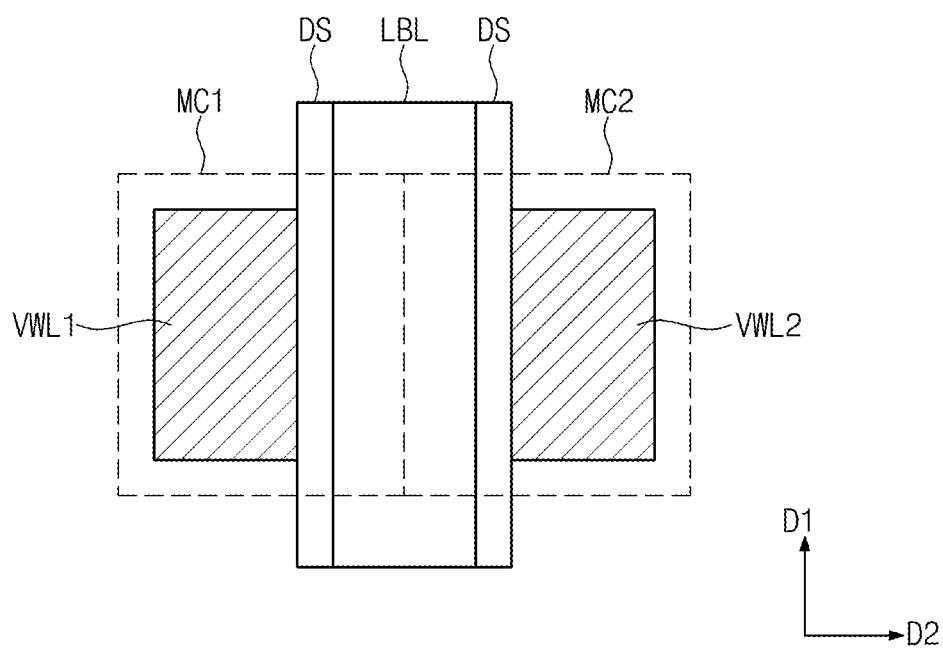
FIG. 6 is a plan view illustrating a portion of a memory cell array of a semiconductor memory device according to example embodiments of inventive concepts.

FIG. 5 is a schematic circuit diagram illustrating a portion of a memory cell array of a semiconductor memory device according to example embodiments of inventive concepts. FIG. 6 is a plan view illustrating a portion of a memory cell array of a semiconductor memory device according to example embodiments of inventive concepts.

Referring to FIGS. 5 and 6, each of the vertical cell groups VCG includes the first and second memory cells MC1 and MC2 in the memory cell array 110 according to example embodiments of inventive concepts. The first memory cell MC1 may consist of (or include) the local bit line LBL extending in the first direction D1, the first vertical word line VWL1 extending in the third direction D3 to cross the local bit line LBL, and a data storage element DS disposed between the local bit line LBL and the first vertical word line VWL1. The second memory cell MC2 may consist of (or include) the local bit line LBL extending in the first direction D1, the second vertical word line VWL2 parallel to and spaced apart from the first vertical word line VWL1, and a data storage element DS disposed between the local bit line LBL and the second vertical word line VWL2. In the memory cell array 100 according to example embodiments of inventive concepts, the first vertical word line VWL1 is electrically separated from the second vertical word line VWL2, such that the first and second memory cells MC1 and MC2 may be selected independently from each other. The first and second memory cells MC1 and MC2 share the local bit line LBL. The first and second memory cells MC1 and MC2 are three-dimensionally arranged through the vertical cell groups VCG described with reference to FIG. 4. Thus, integration degree of the semiconductor memory device can increase.

A method of selecting a memory cell in a semiconductor memory device according to example embodiments of inventive concepts will be described with reference to FIGS. 3 and 7 hereinafter.

Figure 7:
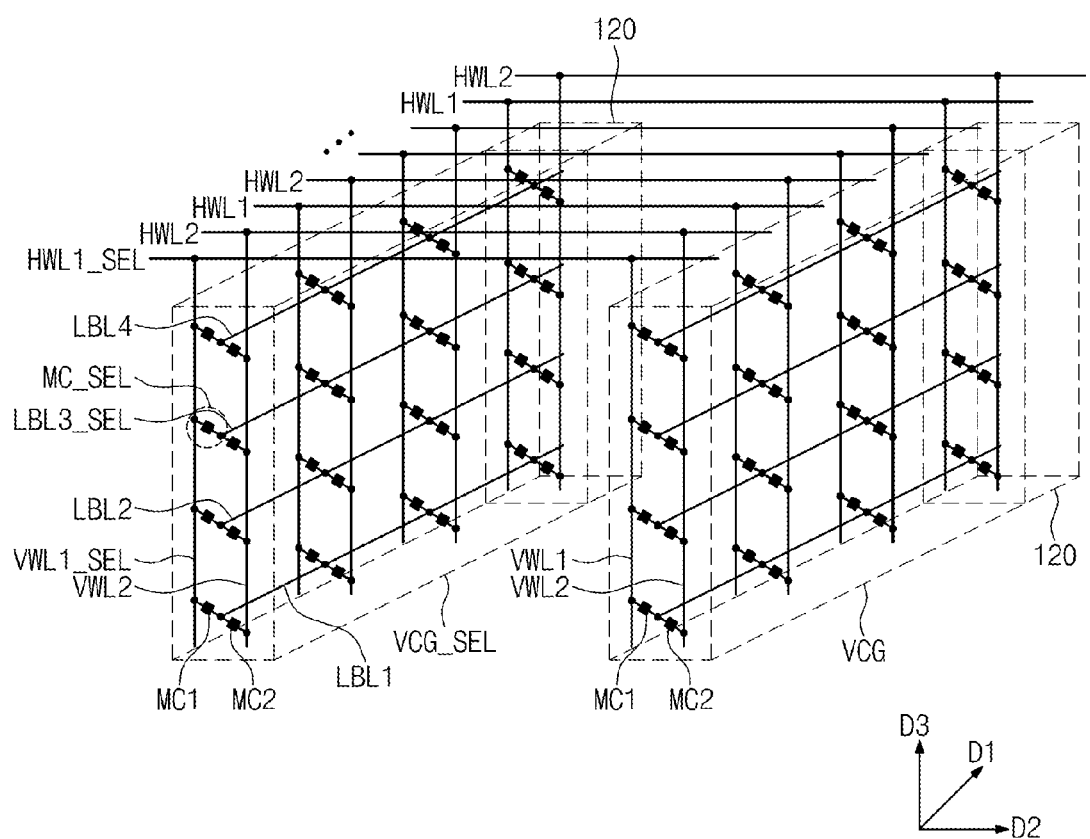
FIG. 7 is a schematic circuit diagram for illustrating a method of selecting one memory cell in a semiconductor memory device according to example embodiments of inventive concepts.

FIG. 7 is a schematic circuit diagram for illustrating a method of selecting one memory cell in a semiconductor memory device according to example embodiments of inventive concepts.

According to example embodiments of inventive concepts, one of the memory blocks BLK may be selected by the block selection signal provided from the block selection line decoder 1 of FIG. 1. In other words, referring to FIG. 3, a turn-on voltage may be applied to the block selection line BSL of the selected memory block BLK. Thus, the block selection transistors BST of the selected memory block BLK may be turned-on, such that the global bit lines GBL may be connected to the vertical cell group selection parts 120. The block selection line decoder 1 of FIG. 1 may apply the turn-on voltage to the block selection line BSL of the selected memory block BLK.

Referring to FIGS. 3 and 7, a vertical cell group VCG_SEL including a desired memory cell MC_SEL may be selected from the vertical cell groups VCG in the selected memory block BLK. In other words, the vertical selection line decoder 3 may apply a turn-on voltage to one of the vertical selection lines VSL, such that one of the vertical cell group selection parts 120 may be selected. Thus, the cell group selection transistors VCST of the selected vertical cell group selection part 120 may be turned-on, so that the local bit lines LBL of the selected vertical cell group VCG_SEL may be electrically connected to the global bit lines GBL.

Next, the WL decoder 2 may apply operating voltages to one selected from the first and second horizontal word lines HWL1 and HWL2. Operating voltages may be applied to one selected from the local bit lines LBL1 to LBL4, respectively, such that one of the first and second memory cells MC1 and MC2 sharing the selected local bit line LBL3_SEL may be selected in the selected vertical cell group VCG_SEL.

In more detail, the sense amplifier-page buffer 5 through the bit line decoder 4 may apply a bit line voltage (e.g., a read voltage, a write voltage, or an erase voltage) to the selected global bit line of the global bit lines GBL. Thus, the bit line voltage may be applied to the selected local bit line LBL3_SEL connected to the selected global bit line in the selected vertical cell group VCG_SEL. Additionally, the word line decoder 2 may apply a word line voltage (e.g., a read voltage, a write voltage (a set or reset voltage), or an erase voltage) to the selected horizontal word line HWL1_SEL of the horizontal word lines HWL1 and HWL2. Thus, the word line voltage may be applied to the plurality of vertical word lines VWL1 connected in common to the selected horizontal word line HWL1_SEL.

A voltage difference between the word line voltage applied to the selected horizontal word line HWL1_SEL and the bit line voltage applied to the selected local bit line LBL3_SEL may be greater than a voltage difference between a voltage applied to unselected local bit lines and a voltage applied to unselected horizontal word lines. The word line voltage applied to the selected horizontal word line HWL1_SEL may be greater or smaller than the bit line voltage applied to the selected local bit line LBL3_SEL. Thus, the resistance state of the resistive memory element of the selected memory cell MC_SEL may be reversibly switched by the voltage difference between the selected horizontal word line HWL1_SEL and the selected local bit line LBL3_SEL. Additionally, the voltage difference between the selected horizontal word line HWL1_SEL and the selected local bit line LBL3_SEL may be controlled in order that the resistive memory element of the selected memory cell MC_SEL has a set state (e.g., a state storing a logic data '1' or an ON state) or a reset state (e.g., a state storing a logic data '0' or an OFF state).

According to example embodiments of inventive concepts, since the first and second memory cells MC1 and MC2 sharing the selected local bit line LBL3_SEL are connected to the vertical word lines VWL1 and VWL2 different from each other, respectively, one of the first and second memory cells MC1 and MC2 can be selected by the selected vertical word line VWL1_SEL and the selected local bit line LBL3_SEL.

Figure 8A:
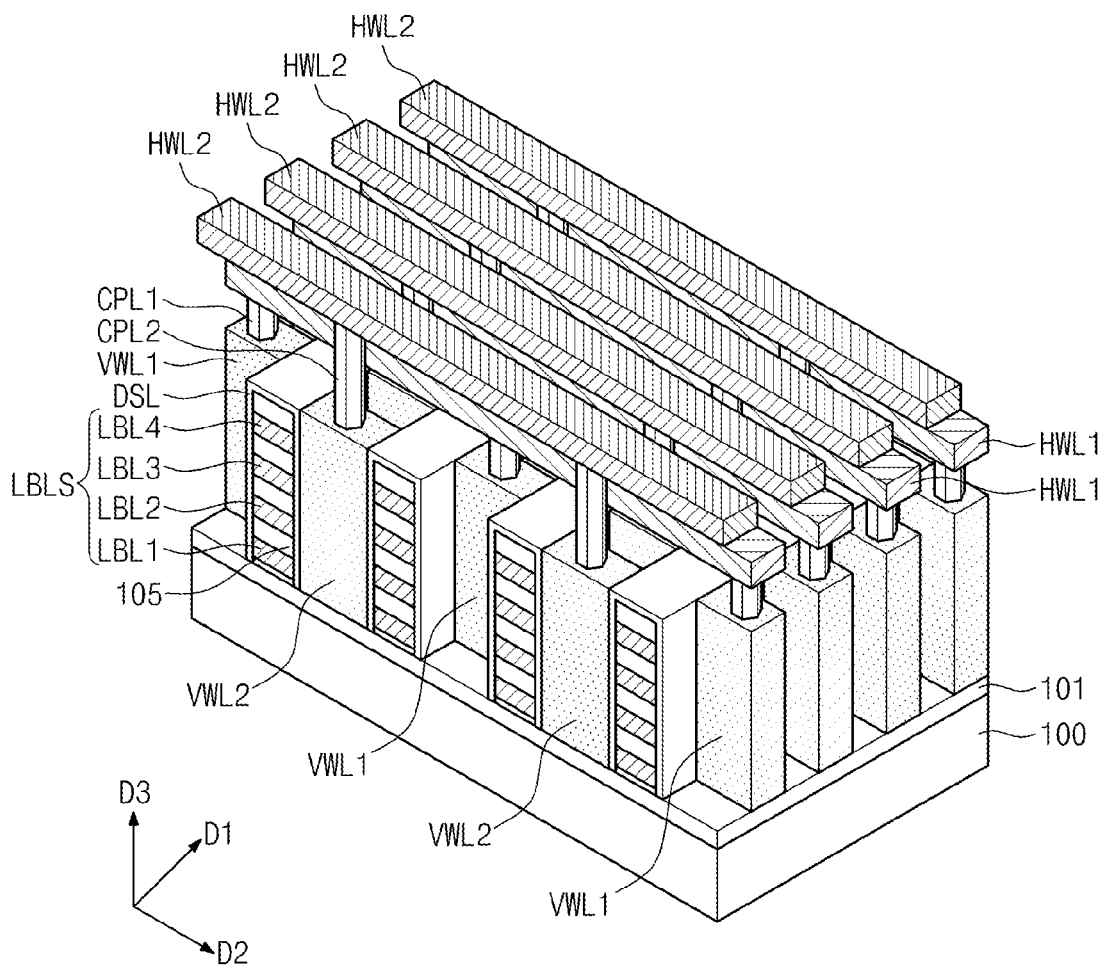
FIG. 8A is a perspective view illustrating a memory cell array according to example embodiments of inventive concepts.
Figure 8B:
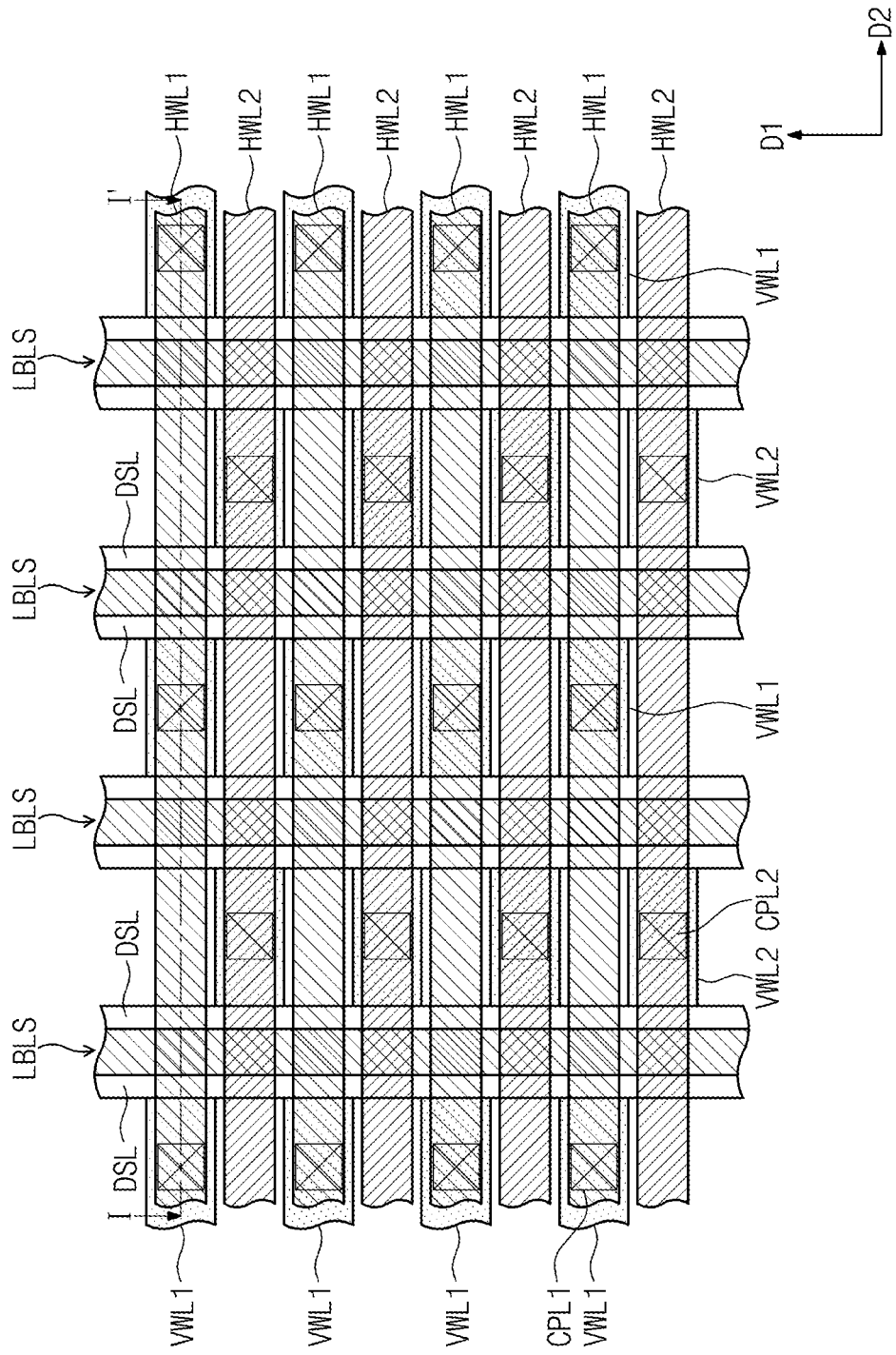
FIG. 8B is a plan view of a memory cell array illustrated in FIG. 8A.
Figure 8C:
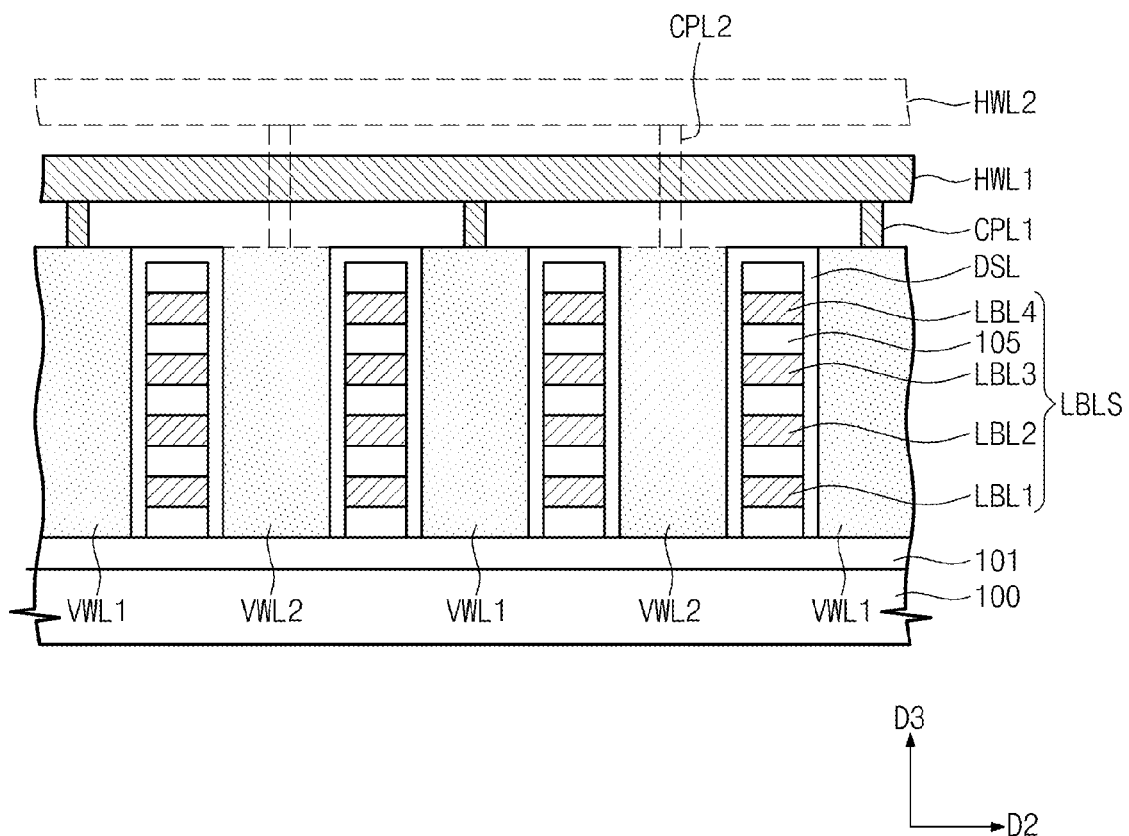
FIG. 8C is a cross-sectional view taken along a line I-I' of FIG. 8B.

FIG. 8A is a perspective view illustrating a memory cell array according to example embodiments of inventive concepts. FIG. 8B is a plan view of a memory cell array illustrated in FIG. 8A. FIG. 8C is a cross-sectional view taken along a line I-I' of FIG. 8B to illustrate a cross-sectional view of a memory cell array illustrated in FIG. 8A.

Referring to FIGS. 8A, 8B, and 8C, a substrate 100 may include one of a semiconductor (e.g., a silicon wafer), an insulating material (e.g., glass), a semiconductor covered by an insulating material, or a conductor covered by an insulating material. However, example embodiments of inventive concepts are not limited thereto.

A plurality of local bit line structures LBLS may be disposed on the substrate 100. In example embodiments of inventive concepts, the local bit line structures LBLS may be disposed on an insulating layer 101 covering a top surface of the substrate 100.

According to example embodiments of inventive concepts, the local bit line structures LBLS may extend in a first direction D1 and may be spaced apart from each other in a second direction D2. Each of the local bit line structures LBLS may have a first sidewall and a second sidewall opposite to each other. Each of the local bit line structures LBLS includes a plurality of local bit lines LBL1 to LBL4 which are stacked in a third direction D3 with interlayer insulating layers 105 therebetween. In other words, the local bit lines LBL1 to LBL4 extending in the first direction D1 may be vertically stacked on the substrate 100. The stacked local bit lines LBL1 to LBL4 may be electrically separated from each other by the interlayer insulating layer 105. The local bit lines LBL1 to LBL4 may be formed of a conductive material. For example, the local bit lines LBL1 to LBL4 may include at least one of a semiconductor material (e.g., silicon, germanium, or silicon-germanium) doped with dopants, a conductive metal nitride (e.g., titanium nitride, tantalum nitride, or tungsten nitride), a metal silicide (e.g., tungsten silicide or cobalt silicide), and a metal (e.g., titanium, tantalum, tungsten, and/or aluminum). Although FIGS. 8A to 8C illustrate local bit line structures LBLS including four local bit lines LBL1 to LBL4, example embodiments of inventive concepts are not limited thereto and the local bit line structures LBLS may alternatively include more than 4 or less than 4 local bit lines.

According to example embodiments of inventive concepts, first vertical word lines VWL1 crossing the local bit lines LBL1 to LBL4 may be disposed on the first sidewalls of the local bit line structures LBLS. The first vertical word lines VWL1 may be substantially vertical to a top surface of the substrate 100. The first vertical word lines VWL1 may be arranged in the first direction D1 while being spaced apart from each other. Second vertical word lines VWL2 crossing the local bit lines LBL1 to LBL4 may be disposed on the second sidewalls of the local bit line structures LBLS. The second vertical word lines VWL2 may be substantially vertical to the top surface of the substrate 100. The second vertical word lines VWL2 may be arranged in the first direction while being spaced apart from each other.

In example embodiments of inventive concepts, the first vertical word lines VWL1 and the second word lines VWL2 may be alternately arranged in the second direction D2 in a plan view as illustrated in FIGS. 8A and 8B. In other words, the first and second vertical word lines VWL1 and VWL2 may be opposite to each other with the local bit line structure LBLS therebetween in a plan view. Additionally, the second vertical word lines VWL2 may be disposed in a diagonal direction from the first vertical word lines VWL1.

In example embodiments of inventive concepts, the first vertical word line VWL1 or the second vertical word line VWL2 may be disposed between the local bit line structures LBLS adjacent to each other. In other words, the adjacent local bit line structures LBLS may share the first vertical word line VWL1 or the second vertical word line VWL2. A width of each of the first and second vertical word lines VWL1 and VWL2 may be equal to or greater than a half of a distance between the local bit line structures LBLS adjacent to each other and may be less than the distance between the local bit line structures LBLS adjacent to each other.

In example embodiments of inventive concepts, a plurality of first horizontal word lines HWL1 and a plurality of second horizontal word lines HWL2 may be disposed on the local bit line structures LBLS to cross over the local bit lines LBL1 to LBL4. The first and second horizontal word lines HWL1 and HWL2 may extend in parallel to each other in the second direction D2 and may be spaced apart from each other in the first direction D1. In a plan view, the second horizontal word line HWL2 is disposed between the first horizontal word lines HWL1 adjacent to each other. In other words, the first and second horizontal word lines HWL1 and HWL2 may be alternately arranged in the first direction D1.

In example embodiments of inventive concepts, the number of the first horizontal word lines HWL1 may be equal to the number of the local bit lines LBL1 to LBL4 consisting (or including) of one local bit line structure LBLS. In other words, the number of the first horizontal word lines HWL1 may be equal to the stacked number of the local bit lines LBL1 to LBL4 stacked on the substrate 100. Likewise, the number of the second horizontal word lines HWL2 may be equal to the number of the local bit lines LBL1 to LBL4 consisting (or including) of one local bit line structure LBLS. Each of the first horizontal word lines HWL1 may be connected in common to the first vertical word lines VWL1 arranged in the second direction D2 under each of the first horizontal word lines HWL1 through first contact plugs CPL1. Each of the second horizontal word lines HWL2 may be connected in common to the second vertical word lines VWL2 arranged in the second direction D2 under each of the second horizontal word lines HWL2 through second contact plugs CPL2.

The first horizontal word lines HWL1 may be disposed from the top surface of the substrate 100 at a different vertical distance from the second horizontal word lines HWL2 are disposed. In example embodiments of inventive concepts, the first and second horizontal word lines HWL1 and HWL2 may be electrically separated from each other. Thus, the first vertical word line VWL1 is electrically separated from the second vertical word line VWL2. In example embodiments of inventive concepts, the first horizontal word lines HWL1 may be higher than a top surface of the local bit line structure LBLS and may be lower than the second horizontal word lines HWL2 in a cross-sectional view.

In example embodiments of inventive concepts, a data storage layer DSL may be disposed between each of the local bit lines LBL1 to LBL4 and each of the first and second vertical word lines VWL1 and VWL2. The data storage layer DSL may cover the first and second sidewalls and the top surfaces of the local bit line structures LBLS. The data storage layer DSL may include a material which may be reversibly switched between at least two resistance states clearly distinguished from each other by a desired (and/or alternatively predetermined) voltage applied between both ends thereof. For example, the data storage layer DSL may include an insulating material exhibiting a perovskite crystal phase, an insulating metal oxide presented as MOx, or any combination thereof. The insulating material exhibiting a perovskite crystal phase may be an insulating material having an $ABO_3$ structure. However, example embodiments of inventive concepts are not limited thereto. For example, the insulating material exhibiting a perovskite crystal phase may include at least one of $PbZrTiO_3$, $PrCaMnO_3$, $(Ba, Sr)TiO_3$ doped with calcium, or $SrZrO_3$. In the insulating metal oxide (MOx), 'M' denotes a metal and the metal (M) may include a transition metal. In other words, the insulating metal oxide (MOx) may be a transition metal oxide or a noble metal oxide. For example, the transition metal may include nickel (Ni), niobium (Nb), titanium (Ti), zirconium (Zr), hafnium (Hf), cobalt (Co), iron (Fe), copper (Cu), manganese (Mn), or chromium (Cr). The transition metal oxide may further contain an impurity such as lithium (Li), calcium (Ca), or lanthanum (La). Alternatively, the data storage layer DSL may include a phase change material of which a resistivity is changed by a temperature and/or a supply time of a supplied heat. For example, the data storage layer DSL may be formed of a compound including at least one of chalcogenide elements (e.g., tellurium (Te) and selenium (Se)) and at least one of germanium (Ge), antimony (Sb), bismuth (Bi), lead (Pb), tin (Sn), silver (Ag), arsenic (As), sulfur (S), silicon (Si), phosphorus (P), oxygen (O), and nitrogen (N). In still another embodiment, the data storage layer DSL may include a magnetic tunnel junction (MTJ) of which a resistance value is changed depending on magnetization directions of a free layer and a reference layer (or a fixed layer).

Figure 9A:
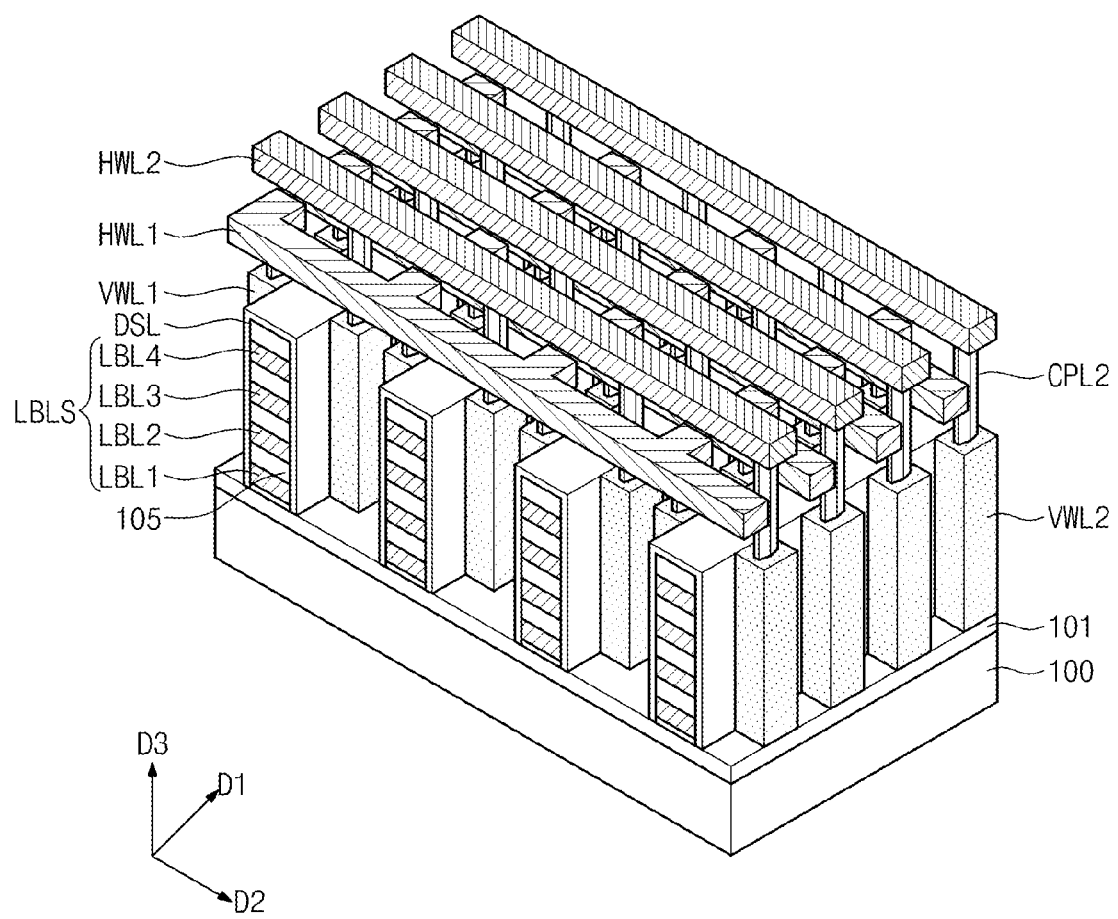
FIG. 9A is a perspective view illustrating a memory cell array according to example embodiments of inventive concepts.
Figure 9B:
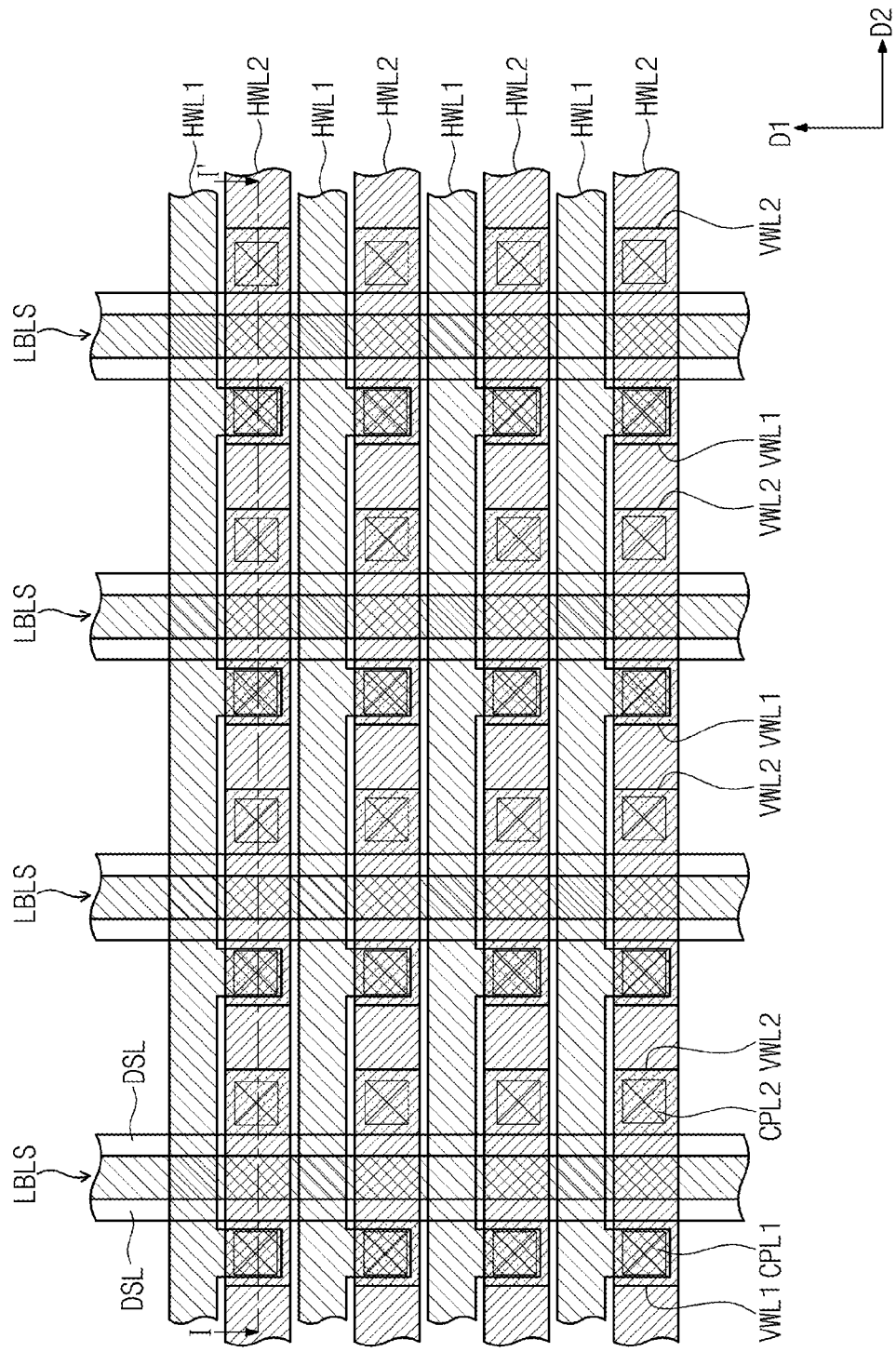
FIG. 9B is a plan view of a memory cell array illustrated in FIG. 9A.
Figure 9C:
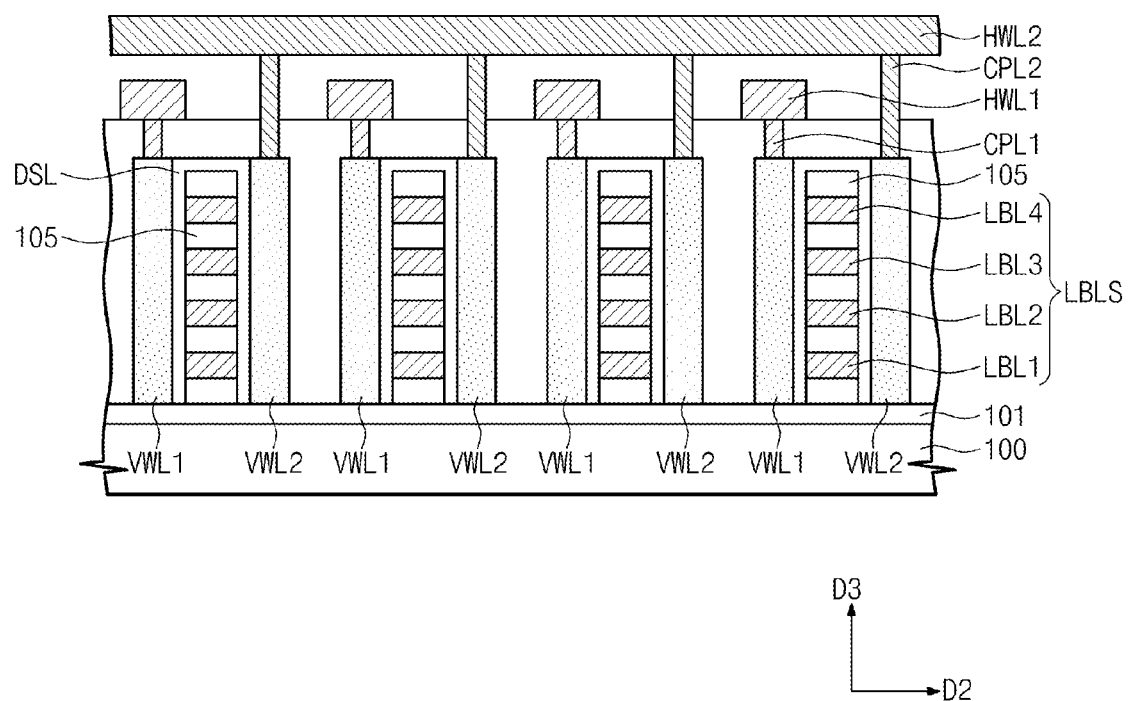
FIG. 9C is a cross-sectional view taken along a line I-I' of FIG. 9B.

FIG. 9A is a perspective view illustrating a memory cell array according to example embodiments of inventive concepts. FIG. 9B is a plan view of a memory cell array illustrated in FIG. 9A. FIG. 9C is a cross-sectional view taken along a line I-I' of FIG. 9B to illustrate a cross-sectional view of a memory cell array illustrated in FIG. 9A.

In a semiconductor memory device illustrated in FIGS. 9A, 9B, and 9C, the same elements as described in FIGS. 8A, 8B, and 8C will be indicated by the same reference numerals or the same reference designators. For the purpose of ease and convenience in explanation, the descriptions to the same elements as in the embodiment in FIGS. 8A, 8B, and 8C will be omitted or mentioned briefly.

Referring to FIGS. 9A, 9B, and 9C, the local bit line structures LBLS may be disposed on the substrate 100 to extend in the first direction D1. The local bit line structures LBLS are spaced apart from each other in the second direction D2. First vertical word lines VWL1 may be disposed on first sidewalls of the local bit line structures LBLS, and second vertical word lines VWL2 may be disposed on second sidewalls of the local bit line structures LBLS. In other words, the first vertical word line VWL1 may be opposite to the second vertical word line VWL2 with the local bit line structures LBLS therebetween. Additionally, in example embodiments of inventive concepts, the first vertical word line VWL1 and the second vertical word line VWL2 may be disposed between the local bit line structures LBLS may be adjacent to each other. The first and second vertical word lines VWL1 and VWL2 between the local bit line structures LBLS adjacent to each other may be spaced apart from each other in the second direction D2. In other words, a width of each of the first and second vertical word lines VWL1 and VWL2 may be less than a half of a distance between the local bit line structures LBLS adjacent to each other. A first contact plug CPL1 may be disposed on each of the first vertical word lines VWL1, and a second contact plug CPL2 may be disposed on each of the second vertical word lines VWL2. In example embodiments of inventive concepts, the first and second contact plugs CPL1 and CPL2 may be alternately arranged in the second direction D2 to constitute a row. As illustrated in FIGS. 9A and 9B, a plurality of the rows consisting (and/or including) of the first and second contact plugs CPL1 and CPL2 may be provided on the substrate 100.

First and second horizontal word lines HWL1 and HWL2 may be disposed on the local bit line structures LBLS. The first horizontal word lines HWL1 may be disposed at a height (or a vertical distance) different from a height (or a vertical distance) of the second horizontal word lines HWL2 from the top surface of the substrate 100. In example embodiments of inventive concepts, the first horizontal word lines HWL1 may be higher than top surfaces of the local bit line structures LBLS and may be lower than the second horizontal word lines HWL2 in a vertical view. In a plan view, each of the first horizontal word lines HWL1 may include an interconnection portion crossing over the local bit lines LBL1 to LBL4, and contact portions. The contact portions of each of the horizontal word lines HWL1 may extend from the interconnection portion in the first direction D1 to be connected to the first contact plugs CPL1, respectively. The second horizontal word lines HWL2 may be connected to the second contact plugs CPL2 between the interconnection portions of the first horizontal word lines HWL1 in a plan view.

Figure 10A:
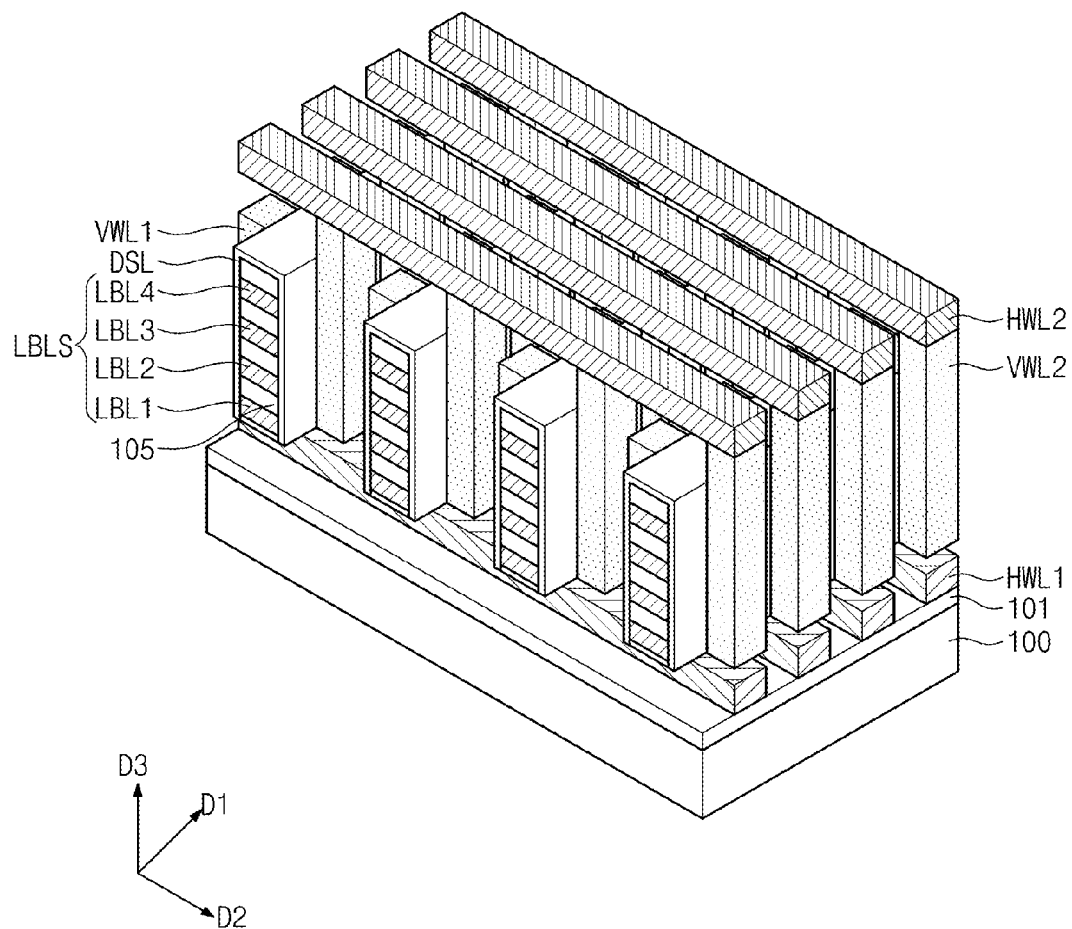
FIG. 10A is a perspective view illustrating a memory cell array according to example embodiments of inventive concepts.
Figure 10B:
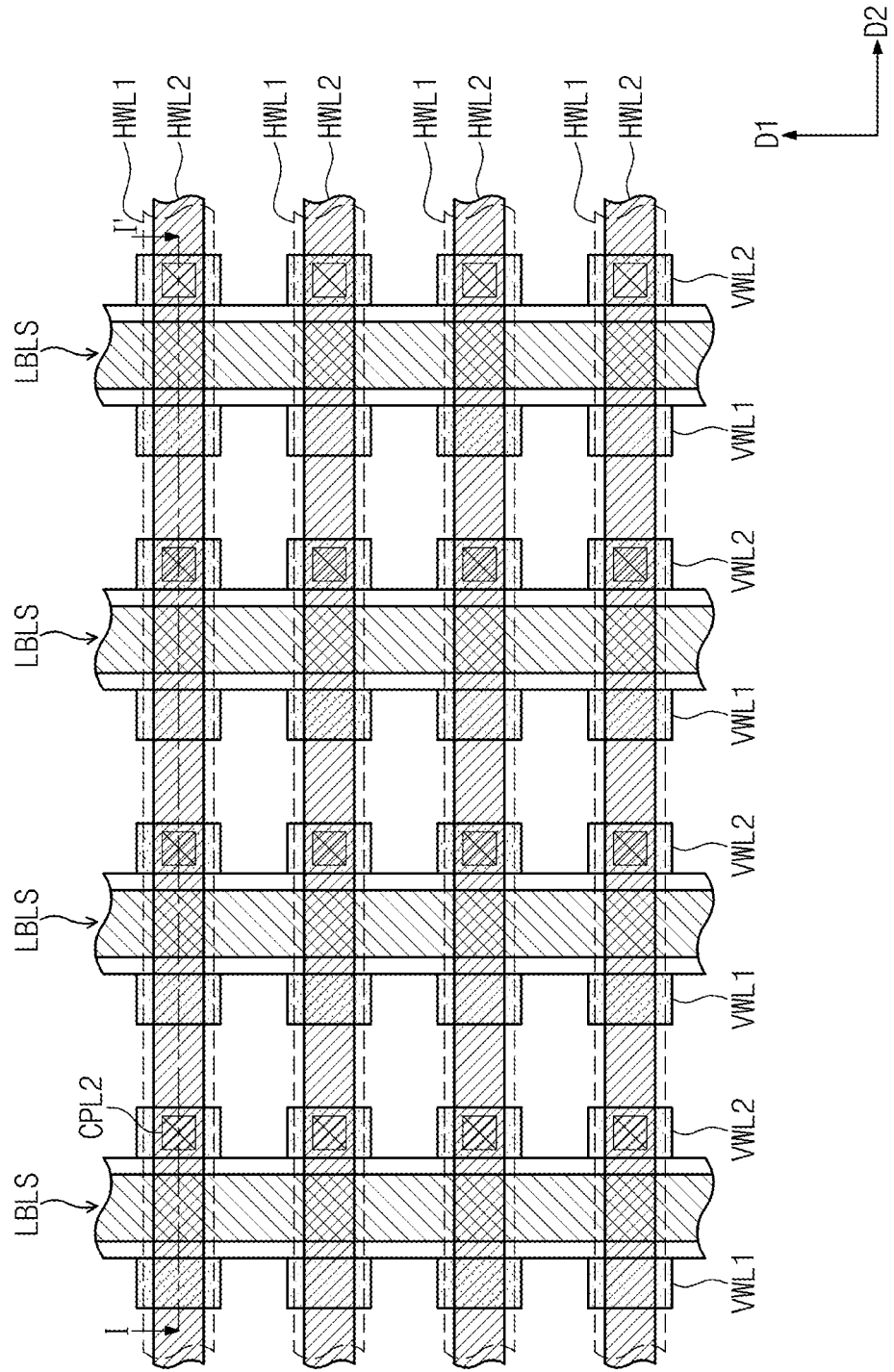
FIG. 10B is a plan view of a memory cell array illustrated in FIG. 10A.
Figure 10C:
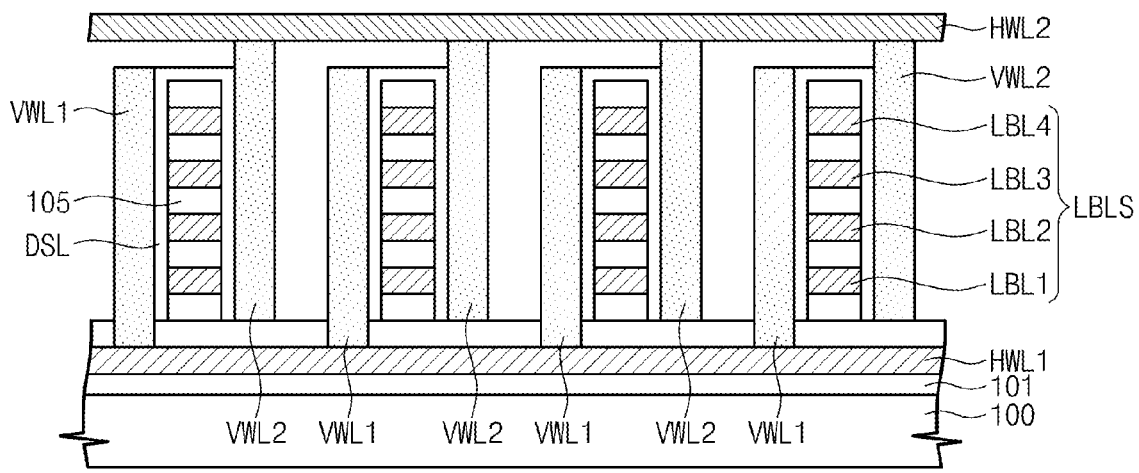
FIG. 10C is a cross-sectional view taken along a line I-I' of FIG. 10B.
Figure 10C:
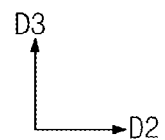

FIG. 10A is a perspective view illustrating a memory cell array according to example embodiments of inventive concepts. FIG. 10B is a plan view of a memory cell array illustrated in FIG. 10A. FIG. 10C is a cross-sectional view taken along a line I-I' of FIG. 10B to illustrate a cross-sectional view of a memory cell array illustrated in FIG. 10A.

In a semiconductor memory device illustrated in FIGS. 10A, 10B, and 10C, the same elements as described in the embodiment illustrated in FIGS. 8A, 8B, and 8C will be indicated by the same reference numerals or the same reference designators. For the purpose of ease and convenience in explanation, the descriptions to the same elements as in the embodiment in FIGS. 8A, 8B, and 8C will be omitted or mentioned briefly.

Referring to FIGS. 10A, 10B, and 10C, the local bit line structures LBLS are disposed on the substrate 100 to extend in the first direction D1. The local bit line structures LBLS are spaced apart from each other in the second direction D2. First vertical word lines VWL1 may be disposed on first sidewalls of the local bit line structures LBLS, and second vertical word lines VWL2 may be disposed on second sidewalls of the local bit line structures LBLS. In other words, the first vertical word line VWL1 may be opposite to the second vertical word line VWL2 with the local bit line structures LBLS therebetween. In example embodiments of inventive concepts, the first vertical word line VWL1 and the second vertical word line VWL2 may be disposed between the local bit line structures LBLS adjacent to each other.

In example embodiments of inventive concepts, first horizontal word lines HWL1 may be disposed between the substrate 100 and the local bit line structures LBLS, second horizontal word lines HWL2 may be disposed on the local bit line structures LBLS. The first and second horizontal word lines HWL1 and HWL2 are insulated from the local bit line structures LBLS.

The first horizontal word lines HWL1 may be disposed on the insulating layer 101 of the substrate 100 to extend in a direction crossing the local bit lines LBL1 to LBL4 (i.e., the second direction D2) in parallel to each other. Each of the first horizontal word lines HWL1 may be connected in common to the first vertical word lines VWL1 arranged in the second direction D2. In other words, the first vertical word lines VWL1 may extend in the third direction D3 on the first horizontal word line HWL1.

The second horizontal word lines HWL2 may extend in parallel to each other in the direction crossing the local bit lines LBL1 (i.e., the second direction D2). In a plan view, the second horizontal word lines HWL2 may overlap with the first horizontal word lines HWL1, respectively. Each of the second horizontal word lines HWL2 may be connected in common to the second vertical word lines VWL2 arranged in the second direction D2.

Figure 11:
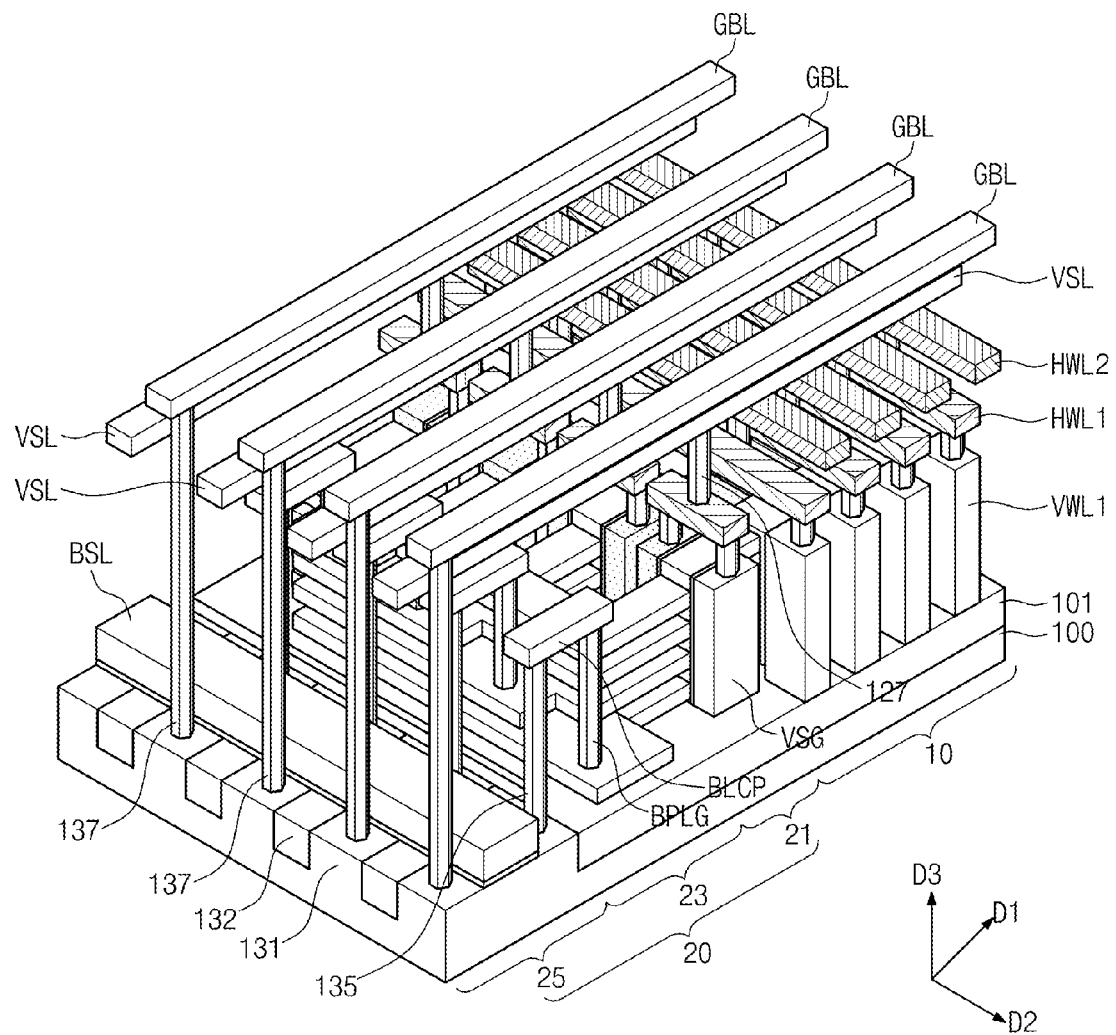
FIG. 11 is a perspective view illustrating a memory block of a semiconductor memory device according to example embodiments of inventive concepts.
Figure 12:
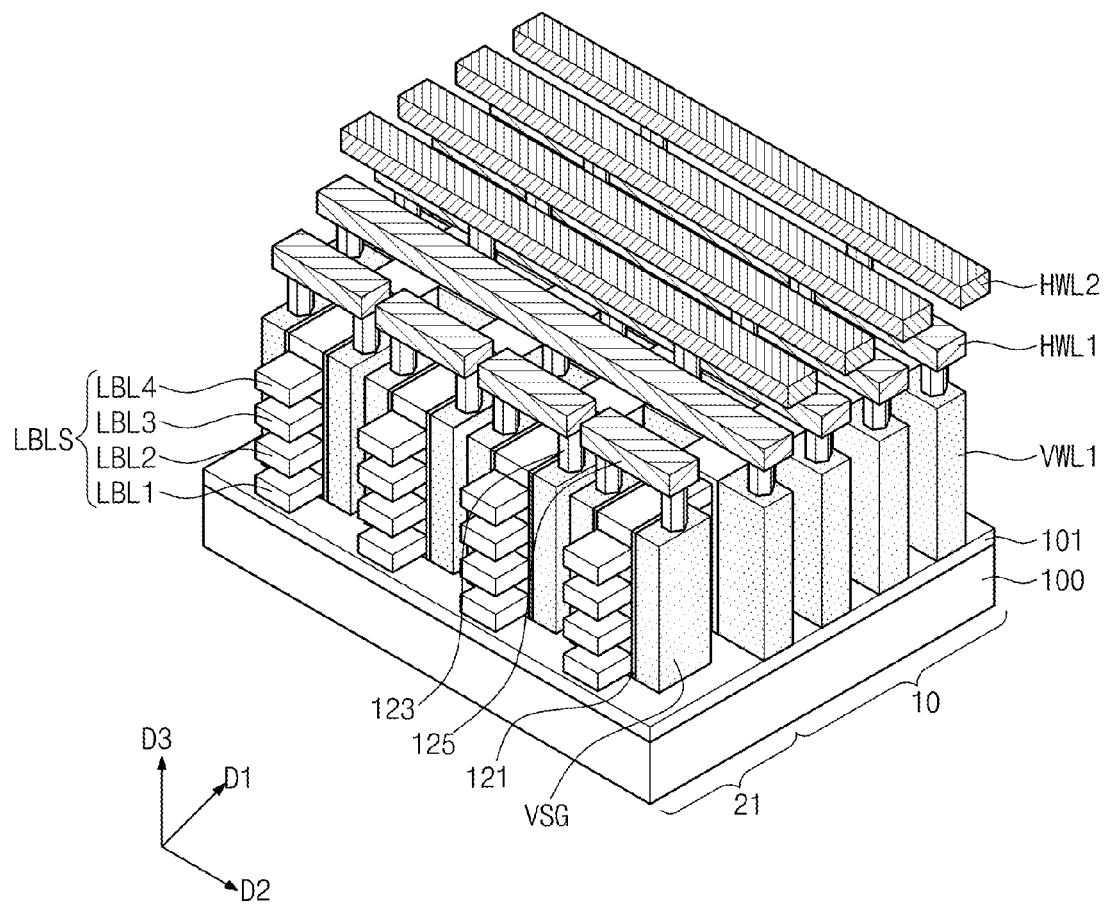
FIG. 12 is a perspective view illustrating a vertical cell group selection part of a memory block illustrated in FIG. 11.
Figure 13:
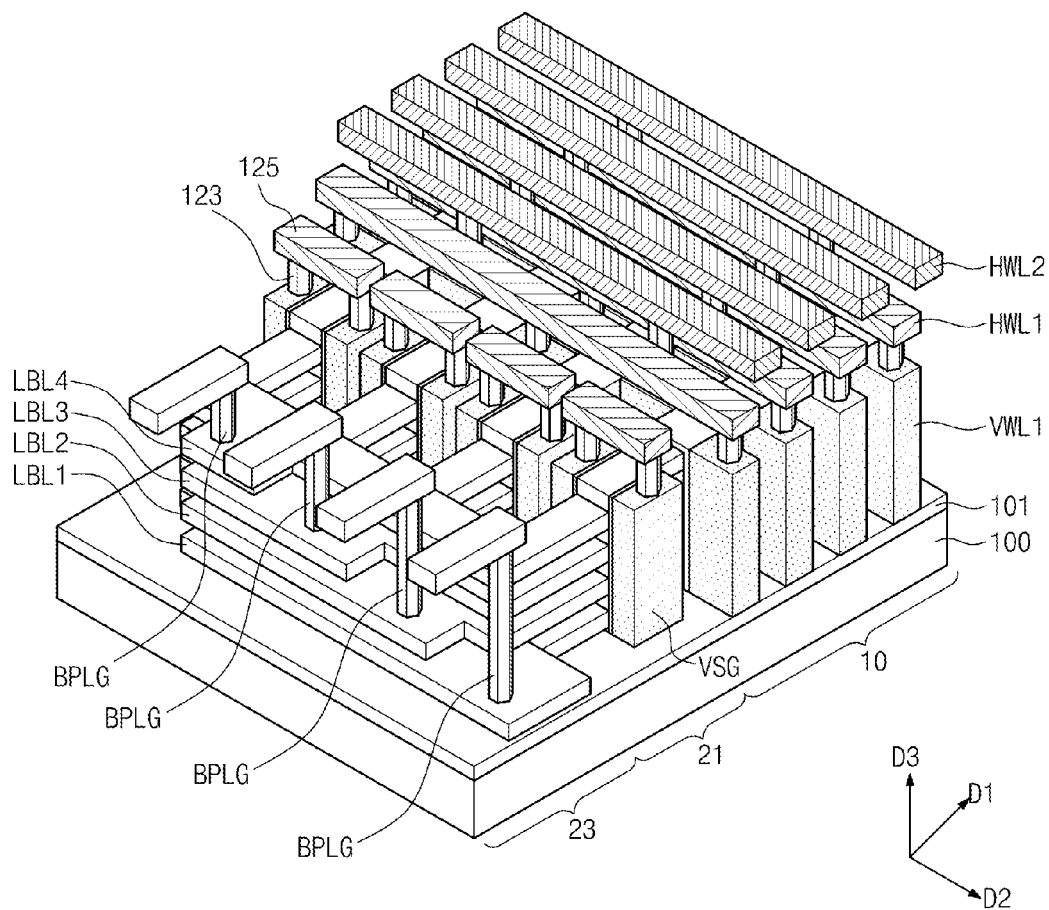
FIGS. 13 and 14 are a perspective view and a plan view illustrating a pad structure of stacked interconnection patterns in a semiconductor memory device according to example embodiments of inventive concepts, respectively.
Figure 14:
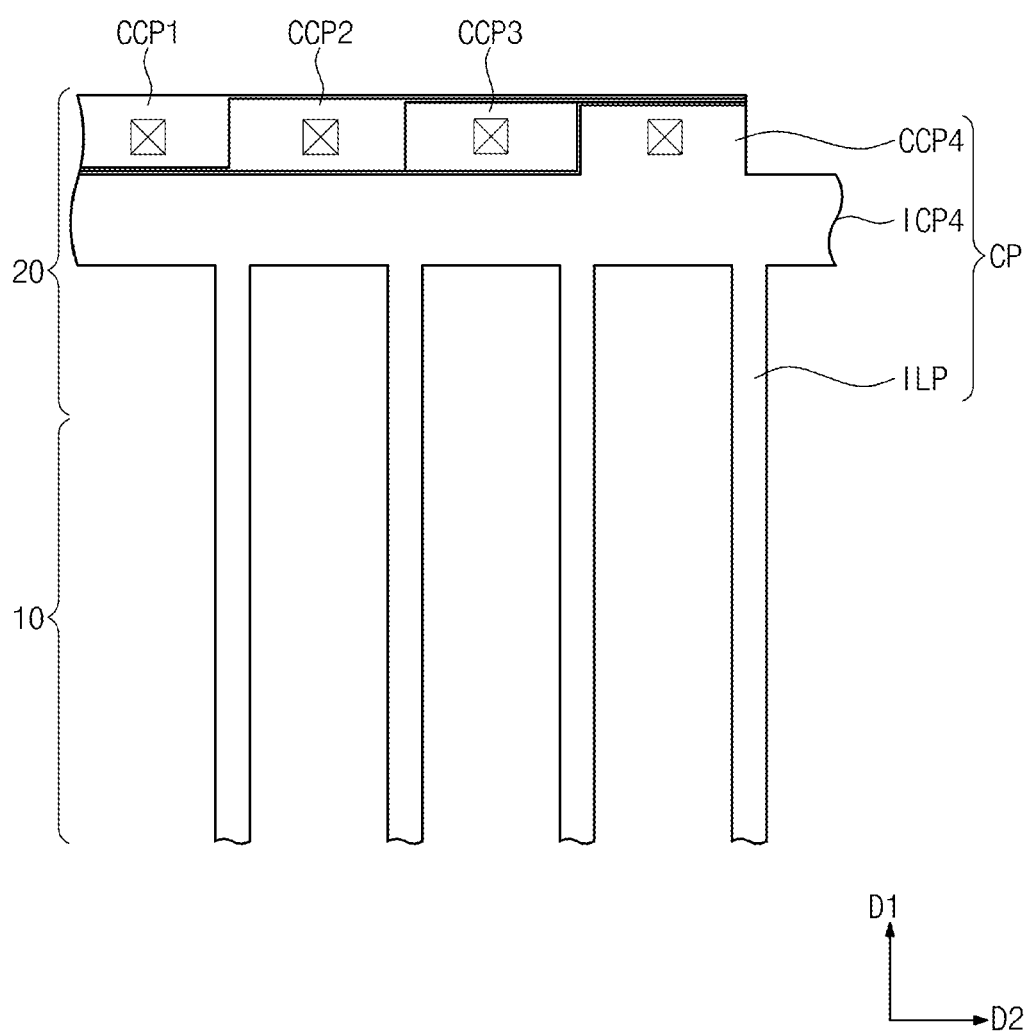

FIG. 11 is a perspective view illustrating a memory block of a semiconductor memory device according to example embodiments of inventive concepts. FIG. 12 is a perspective view illustrating a vertical cell group selection part of a memory block illustrated in FIG. 11. FIGS. 13 and 14 are a perspective view and a plan view illustrating a pad structure of stacked interconnection patterns in a semiconductor memory device according to example embodiments of inventive concepts, respectively.

Referring to FIGS. 11 to 14, a substrate 100 may include a cell array region 10 and a peripheral circuit region 20. The peripheral circuit region 20 may include a vertical cell group selection region 21, a block selection region 25, and a contact region 23 between the vertical cell group selection region 21 and the block selection region 25.

The memory cell array 110 according to example embodiments of inventive concepts is disposed on the substrate 100 of the cell array region 10. For example, any one of the memory cell arrays 110 illustrated in FIGS. 8A to 8C, 9A to 9C, and 10A to 10C may be formed on the substrate 100 of the cell array region 10. For example, the plurality of local bit line structures LBLS extending in the first direction D1 may be disposed on the substrate 100 of the cell array region 10, and the first and second vertical word lines VWL1 and VWL2 may be disposed on both sidewalls of the local bit line structures LBLS. The first and second horizontal word lines HWL1 and HWL2 may be disposed on the local bit lines LBL1 to LBL4 to cross over the local bit lines LBL1 to LBL4. The first horizontal word lines HWL1 may be disposed at a vertical height different from a vertical height of the second horizontal word lines HWL2 from the substrate 100.

Referring to FIGS. 11 and 12, the vertical cell group selection parts 120 of FIG. 3 may be disposed on the substrate 100 of the vertical cell group selection region 21. Each of the vertical cell group selection parts 120 of FIG. 3 includes the plurality of vertical cell group selection transistors VCST of FIG. 3. Each of the vertical cell group selection parts 120 of FIG. 3 may consist of (and/or include) one local bit line structures LBLS and vertical selection gate electrodes VSG disposed on both sidewalls thereof. In other words, the plurality of vertical cell group selection transistors VCST of FIG. 3 may be constituted by the vertically stacked local bit lines LBL1 to LBL4 and the vertical selection gate electrodes VSG.

According to example embodiments of inventive concepts, the local bit line structures LBLS may extend from the memory cell array region 110 into the vertical cell group selection region 21 and the contact region 23. According to example embodiments of inventive concepts, the local bit lines LBL1 to LBL4 may include a semiconductor material in the vertical cell group selection region 21, and the local bit lines LBL1 to LBL4 may be used as channel regions of the vertical cell group selection transistors in the vertical cell group selection region 21.

In more detail, the vertical selection gate electrodes VSG may be disposed on the substrate 100 of the vertical cell group selection region 21. As illustrated in FIG. 12, the vertical selection gate electrodes VSG may be disposed on both sidewalls of each of the local bit line structures LBLS with a gate insulating layer 121 therebetween. The vertical selection gate electrodes VSG disposed on both sidewalls of each of each of the local bit line structures LBLS may be electrically connected to each other through contact plugs 123 and a conductive pad 125. The conductive pad 125 may be disposed on each of the local bit line structures LBLS. The conductive pads 125 may be electrically and physically separated from each other. Referring to FIG. 11, a selection line contact plug 127 may be connected to each of the conductive pads 124. The selection line contact plug 127 may be connected to a vertical selection line VSL. The vertical selection lines VSL respectively corresponding to the vertical cell group selection parts 120 of FIG. 4 may extend in parallel to each other in the first direction D1. Electrical potentials of the local bit lines LBL1 to LBL4 may be controlled by a voltage applied to the vertical selection line VSL connected to the vertical selection gate electrodes VSG adjacent to the local bit lines LBL1 to LBL4.

Referring to FIGS. 13 and 14, the local bit line structures LBLS may extend from the cell array region 10 and the vertical group selection region 21 onto the substrate 100 of the contact region 23. In example embodiments of inventive concepts, the local bit lines, which are disposed at the same height from the substrate 100 in the local bit line structures LBLS, may be connected to each other on the substrate 100 of the contact region 23. In other words, interconnection patterns CP corresponding to the local bit lines may be vertically stacked on the substrate 100. Each of the interconnection patterns CP may include a plurality of interconnection portions ILP, a connection pad portion ICP horizontally connecting the interconnection portions ILP to each other, and a contact pad portion CCP horizontally protruding from the connection pad portion ICP. The connection pad portion ICP may extend in a direction perpendicular to a long-axis direction (i.e., the first direction D1) of the interconnection portions ILP. Areas of the contact pad portions CCP1 to CCP4 of the stacked interconnection patterns CP may be different from each other. In example embodiments of inventive concepts, the areas of the stacked contact pad portions CCP1 to CCP4 may be reduced from the lowermost contact pad portion CCP1 to the uppermost contact pad CCP4. Insulating layers may be disposed between the stacked interconnection patterns CP, and the interconnection portions ILP of the stacked interconnection patterns CP may constitute the local bit line structures LBLS.

According to example embodiments of inventive concepts, the contact pad portions CCP1 to CCP4 of the stacked interconnection patterns CP may be stacked to have a stepped structure on the substrate 100 of the contact region 23. In the contact pad portions CCP1 to CCP4 vertically adjacent to each other, a relatively higher contact pad portion may expose a portion of a relatively lower contact pad portion. Additionally, the contact pad portions CCP1 to CCP4 of the stacked interconnection patterns CP may be disposed at substantially the same horizontal distance from the cell array region 10. The exposed portions of the contact pad portions CCP1 to CCP4 may be arranged in the second direction D2 perpendicular to the long-axis direction (i.e., the first direction D1) of the interconnection portions ILP. Thus, it is possible to limit (and/or prevent) an increase of a planar area occupied by the stacked contact pad portions CCP1 to CCP4.

Bit line contact plugs BPLG may be connected to the contact pad portions CCP1 to CCP4, respectively. The number of the bit line contact plugs BPLG may be equal to the number of the interconnection patterns CP stacked on the substrate. The bit line contact plugs BPLG may have vertical lengths different from each other, respectively. The bit line contact plugs BLPG may be disposed at substantially the same horizontal distance from the cell array region 10. The stacked interconnection patterns CP may be electrically and physically separated from each other by the bit line contact plugs BLPG.

Referring to FIG. 11 again, the memory block selection part 130 of FIG. 3 may be disposed on the substrate 100 of the block selection region 25. The memory block selection part 130 of FIG. 3 includes the plurality of block selection transistors BST of FIG. 3 corresponding to global bit lines GBL, respectively. The memory block selection part 130 may include a plurality of active regions 131 and one block selection line BSL crossing over the active regions 131. The block selection line BSL may be used as gate electrodes of the plurality of block selection transistors BST of FIG. 3.

In more detail, device isolation layers 132 may be formed in the substrate 100 of the block selection region 25 and the active regions 131 may be defined by the device isolation layers 132 in example embodiments of inventive concepts. The active regions 131 may extend in parallel to each other in the first direction D1.

The block selection line BSL may be disposed on the substrate 100 of the block selection region 25 to cross over the active regions 131, and a gate insulating layer may be disposed between the block selection line BSL and the active regions 131. First dopant regions may be formed in the active regions 131 at a side of the block selection line BSL, respectively. Second dopant regions may be formed in the active regions 131 at another side of the block selection line BSL, respectively.

First electrode plugs 135 may be connected to the first dopant regions, respectively, and second electrode plugs 137 may be connected to the second dopant regions, respectively. Bit line conductive pads BLCP may be connected to the first electrode plugs 135, respectively. The bit line conductive pads BLCP may be connected to the bit line contact plugs BPLG, respectively. The bit line conductive pads BLCP may correspond to the contact pad portions CCP of FIG. 14 disposed at heights different from each other, respectively. The global bit lines GBL may be connected to the second electrode plugs 137, respectively. The global bit lines GBL may be electrically separated from each other and may extend in the first direction D1.

Figure 15:
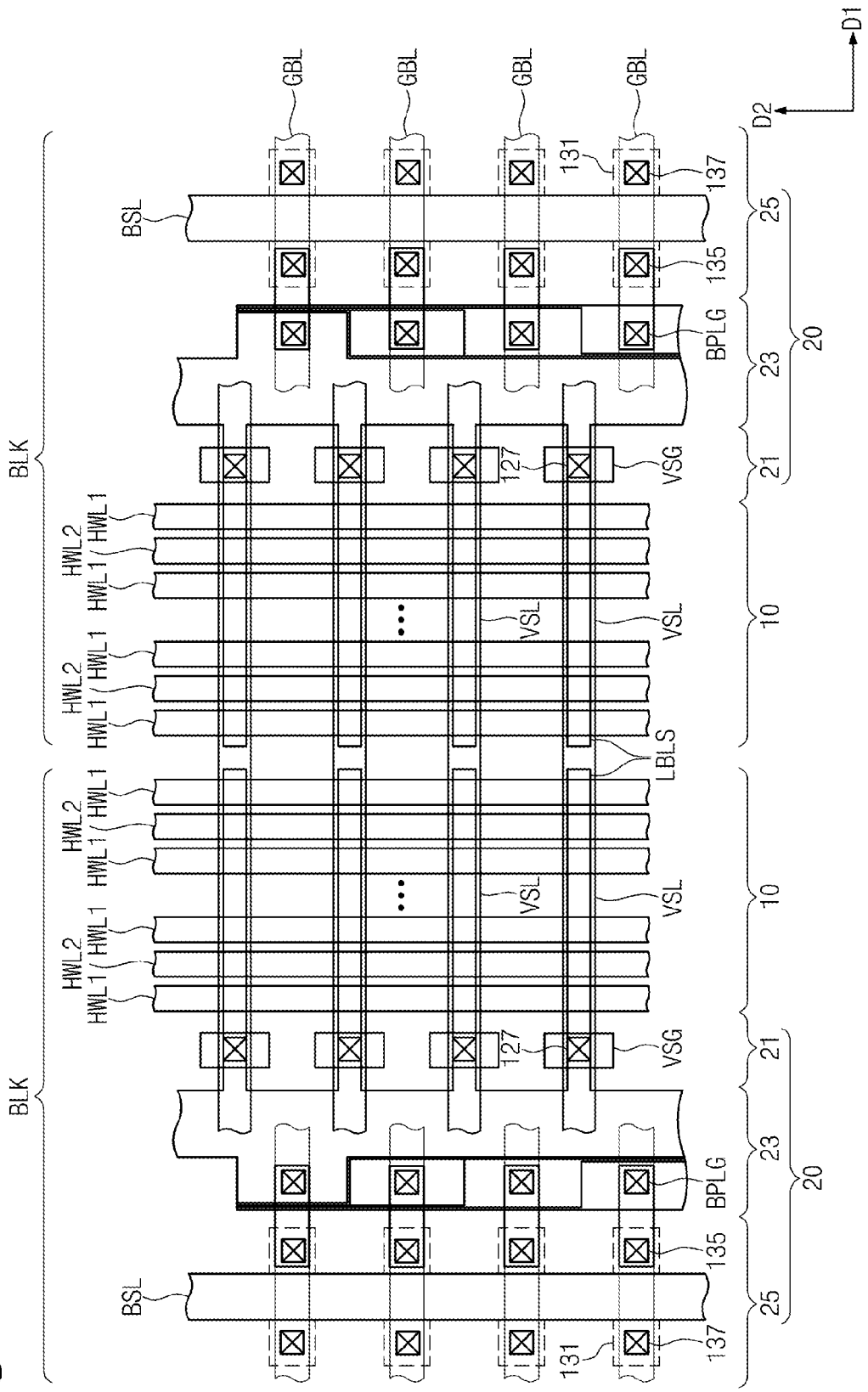
FIGS. 15 and 16 are plan views illustrating arrangement of memory blocks of a semiconductor memory device according to example embodiments of inventive concepts.
Figure 16:
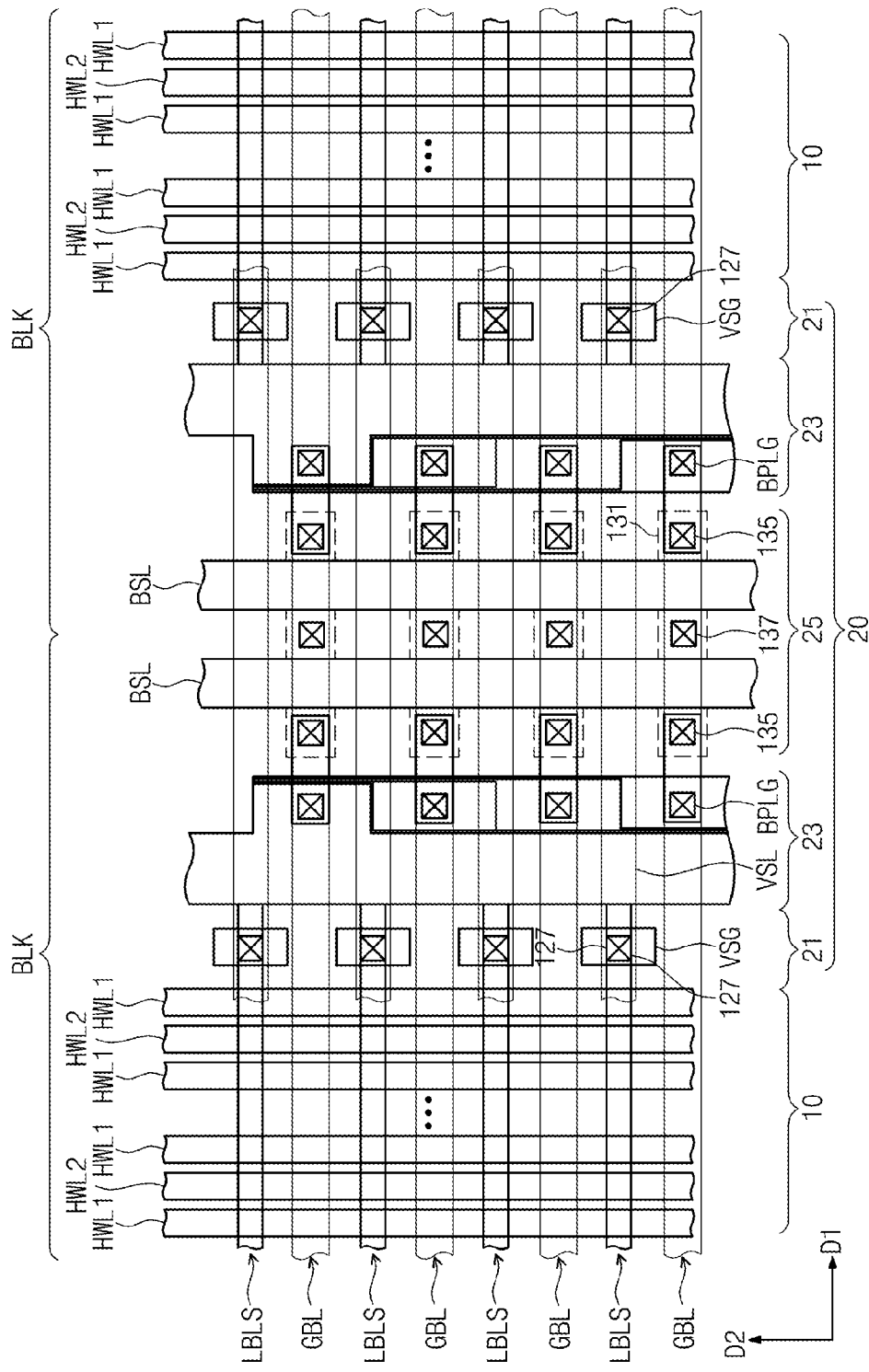

FIGS. 15 and 16 are plan views illustrating arrangement of memory blocks of a semiconductor memory device according to example embodiments of inventive concepts.

According to example embodiments of inventive concepts the semiconductor memory device may include the plurality of memory blocks BLK, and the memory blocks BLK may be disposed to be adjacent to each other. The same elements as described in the embodiment illustrated in FIGS. 11 to 14 will be indicated by the same reference numerals or the same reference designators. For the purpose of ease and convenience in explanation, the descriptions to the same elements as in the embodiment in FIGS. 11 to 14 will be omitted or mentioned briefly.

Referring to FIG. 15, the memory blocks BLK adjacent to each other may be disposed in such a way that their local bit line structures LBLS are adjacent to each other. In other words, the adjacent memory blocks BLK may be disposed to be mirror-symmetric to each other. Additionally, the local bit lines LBL1 to LBL4 in one memory block BLK may be electrically separated from the local bit lines LBL1 to LBL4 in another memory block BLK. In other words, the local bit line structures LBLS adjacent to each other in the first direction D1 may be disposed to be spaced apart from each other.

The plurality of memory blocks BLK may share the vertical selection lines VSL and the global bit lines GBL. The vertical selection lines VSL may be connected to the selection line contact plugs 127 in each of the memory blocks BLK. The global bit lines GBL may be connected to the second electrode plugs 137 in each of the memory blocks BLK.

Referring to FIG. 16, the memory blocks BLK adjacent to each other may share the memory block selection part 130 of FIG. 3. In other words, a single block selection region 25 may be disposed between the cell array regions 10 adjacent to each other. The adjacent memory blocks BLK may share the second dopant regions of the block selection transistors BST and the second electrode plugs 137.

In more detail, a plurality of active regions 131 may be defined at the substrate 100 of the block selection region 25, and two block selection lines BSL may be disposed to cross over the active regions 131. The second dopant regions may be formed the active regions 131 between the two block selection lines BSL, respectively.

Figure 17:
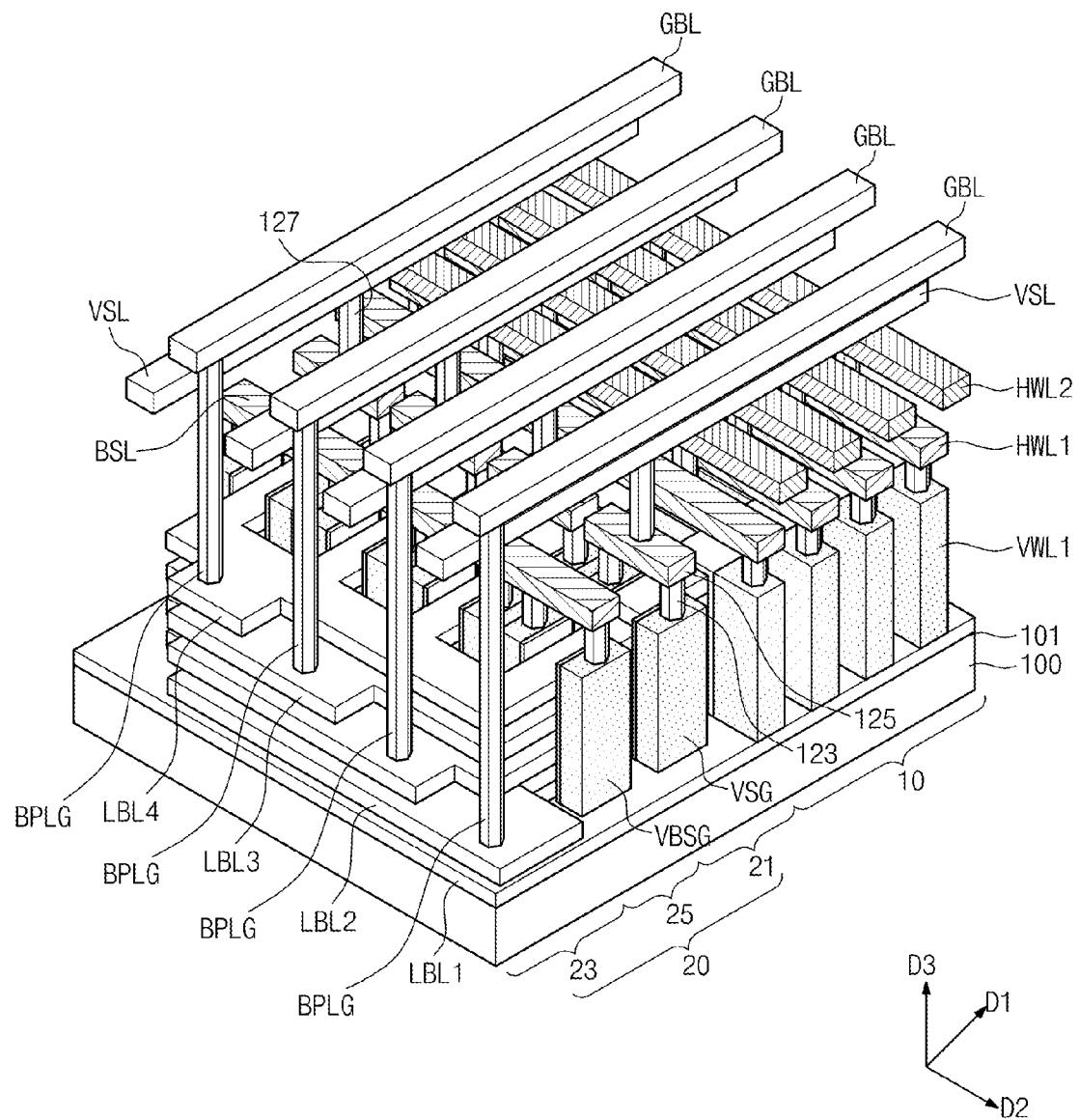
FIG. 17 is a perspective view illustrating a memory block of a semiconductor memory device according to example embodiments of inventive concepts.
Figure 18:
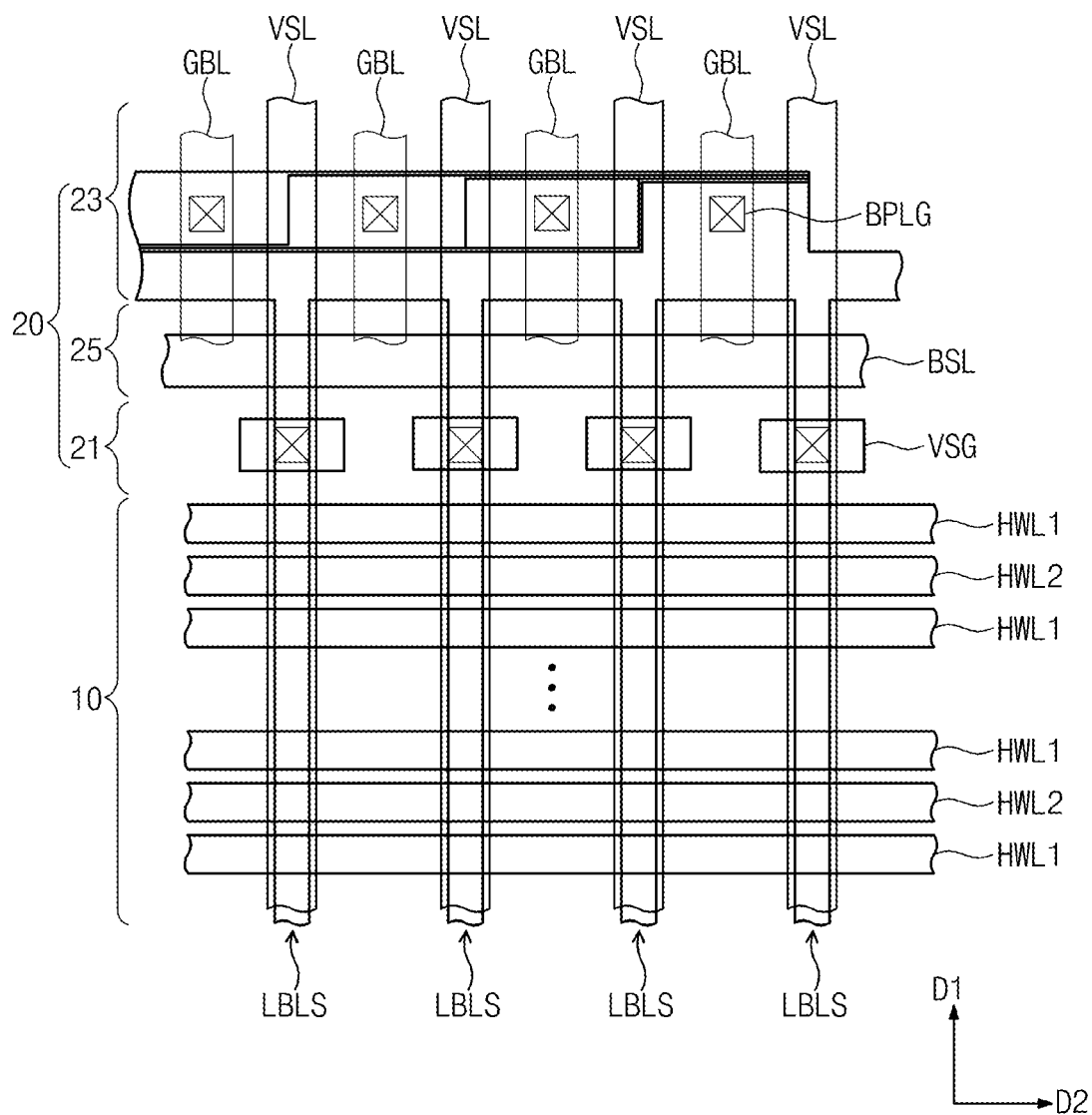
FIG. 18 is a plan view of a memory block illustrated in FIG. 17.

FIG. 17 is a perspective view illustrating a memory block of a semiconductor memory device according to example embodiments of inventive concepts. FIG. 18 is a plan view of a memory block illustrated in FIG. 17.

Referring to FIGS. 17 and 18, a substrate 100 may include a cell array region 10 and a peripheral circuit region 20. The peripheral circuit region 20 may include a vertical cell group selection region 21 adjacent to the cell array region 10, a contact region 23, and a block selection region 25 between the vertical cell group selection region 21 and the contact region 23.

In example embodiments of inventive concepts, the local bit lines structures LBLS may extend from the cell array region 10 into the contact region through the vertical cell group selection region 21 and the block selection region 25. As described with reference to FIG. 13, the local bit lines disposed at the same vertical height from the substrate 100 may be connected in common to the connection pad portion ICP of FIG. 14 in the contact region 23.

As described with reference to FIG. 12, a plurality of vertical selection gate electrodes VSG may be disposed on the substrate 100 of the vertical cell group selection region 21. The vertical selection gate electrodes VSG respectively disposed on both sidewalls of each of the local bit line structures LBLS may be electrically connected to each other.

In example embodiments of inventive concepts, a plurality of vertical block selection gate electrodes VBSG may be disposed on the substrate 100 of the block selection region 25. The vertical block selection gate electrodes VBSG may be disposed on both sidewalls of the local bit line structures LBLS, and a gate insulating layer may be disposed between the vertical block selection gate electrodes VBSG and the sidewalls of the local bit line structures LBLS. The plurality of vertical block selection gate electrodes VBSG in the block selection region 25 may be connected in common to a block selection line BSL. The block selection line BSL may be disposed on the local bit line structures LBLS and may extend in the second direction D2.

According to the embodiment illustrated in FIGS. 17 and 18, the memory block selection part 130 of FIG. 3 may include the vertical block gate electrodes VBSG substantially vertical to the top surface of the substrate 100. The integration degree of the semiconductor memory device may be more improved.

Figure 19:
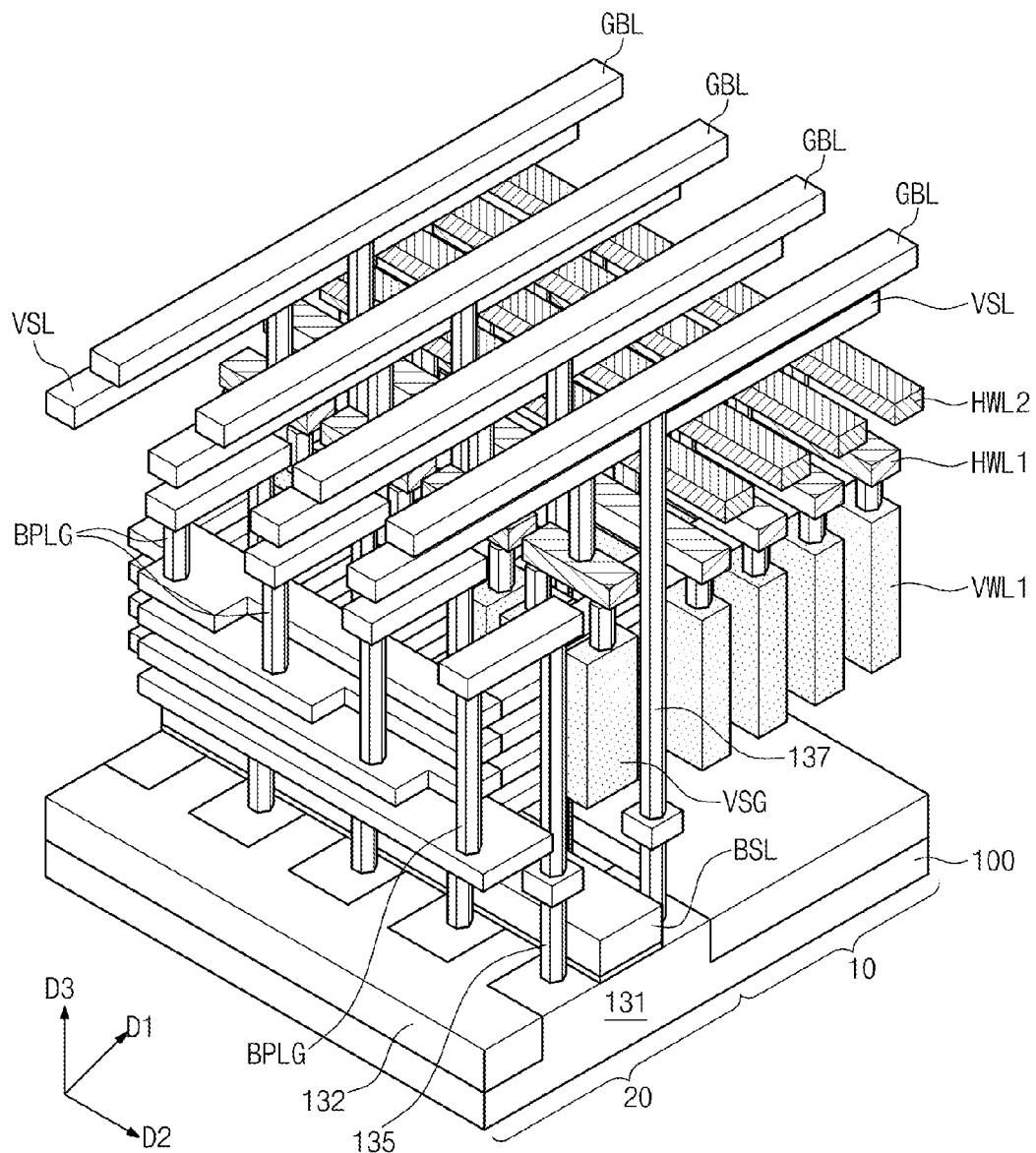
FIG. 19 is a perspective view illustrating a memory block of a semiconductor memory device according to example embodiments of inventive concepts.
Figure 20:
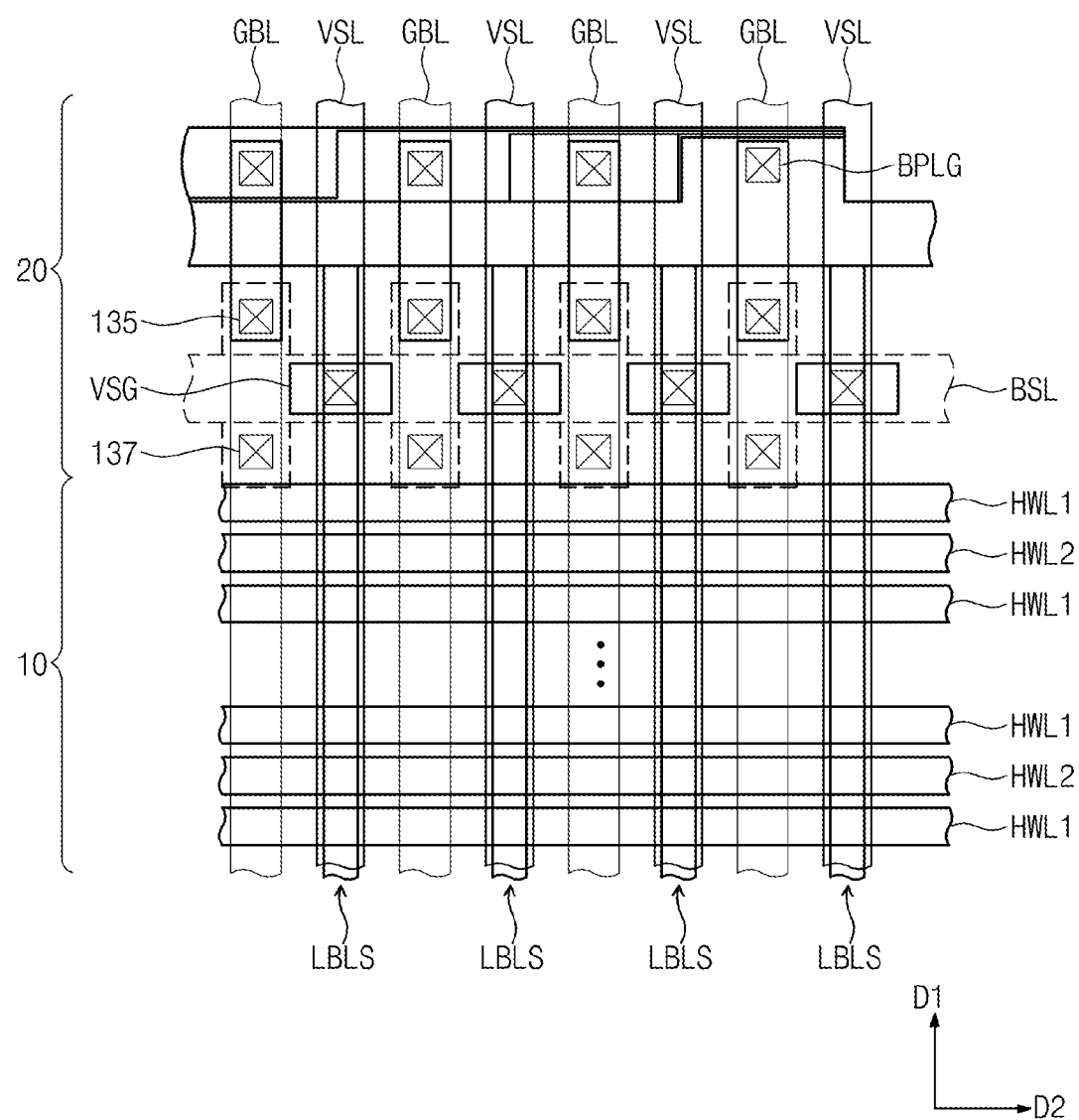
FIG. 20 is a plan view of a memory block illustrated in FIG. 19.

FIG. 19 is a perspective view illustrating a memory block of a semiconductor memory device according to example embodiments of inventive concepts. FIG. 20 is a plan view of a memory block illustrated in FIG. 19.

Referring to FIGS. 19 and 20, a substrate 100 may include a cell array region 10 and a peripheral circuit region 20. The vertical cell group selection parts 120 of FIG. 3 and the memory block selection part 130 of FIG. 3 may be disposed on the substrate 100 of the peripheral circuit region 20. Here, the vertical cell group selection parts 120 of FIG. 3 may be disposed on the memory block selection part 130 of FIG. 3. The memory block selection part 130 of FIG. 3 may be disposed between the substrate 100 and the vertical cell group selection parts 120 of FIG. 3 in a vertical view. In other words, the memory block selection part 130 of FIG. 3 may be disposed at a height different from a height of the vertical cell group selection parts 120 of FIG. 3.

In more detail, device isolation layers 132 may be formed in the substrate 100 of the peripheral circuit region 20 to define active regions 131 in the peripheral circuit region 20. A block selection line BSL may be disposed on the substrate 100 of the peripheral circuit region 20 to cross over the active regions 131. A gate insulating layer may be disposed between the block selection line BSL and the active regions 131. First dopant regions may be formed in the active regions 131 at a side of the block selection line BSL, respectively, and second dopant regions may be formed in the active regions 131 at another side of the block selection line BSL, respectively. First electrode plugs 135 may be connected to the first dopant regions, respectively, and second electrode plugs 137 may be connected to the second dopant regions, respectively.

The memory cell array 110 and the vertical cell group selection parts 120 having the same structures as illustrated in FIG. 12 may be disposed on the substrate 100 on which the memory block selection part 130 is formed. The local bit line structures LBLS of the memory cell array 110 may extend from the cell array region 10 into the peripheral circuit region 20. The local bit lines disposed at the same vertical height may be connected in common to the connection pad portion (referred to ICP of FIG. 14). Bit line contact plugs BPLG are connected to the connection pad portions (referred to ICP of FIG. 14), respectively. The vertical selection gate electrodes VSG of the vertical cell group selection parts 120 of FIG. 3 may be disposed on the block selection line BSL in a vertical view.

The first electrode plug 135 connected to the first dopant region may extend vertically to the top surface of the substrate 100 and may be connected to the bit line contact plug BPLG through a bit line conductive pad BLCP. In example embodiments of inventive concepts, the first electrode plugs 135 connected to the first dopant regions may be disposed between the local bit line structures LBLS in a plan view. Likewise, the second electrode plugs 137 connected to the second dopant regions may be disposed between the local bit line structures LBLS and between the vertical selection gate electrode VSG and the vertical word lines VWL1 and VWL2 in a plan view. Global bit lines GBL may be connected to the second electrode plugs 137, respectively. The global bit lines GBL are electrically separated from each other. The global bit lines GBL may extend in the first direction D1.

In example embodiments of inventive concepts, even though not illustrated in the drawings, the block selection line decoder 1 of FIG. 1, the word line decoder 2 of FIG. 1, the vertical selection line decoder 3 of FIG. 1, the bit line decoder 4 of FIG. 1, and logic circuits such as the control circuit may be disposed between the memory cell array 110 and the substrate 100.

According to the embodiment illustrated in FIGS. 19 and 20, the memory block selection part 130 may be disposed under the vertical cell group selection parts 120, such that the integration degree of the semiconductor memory device may be more improved.

The semiconductor memory devices according to the aforementioned embodiments may be encapsulated using various packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

Figure 21:
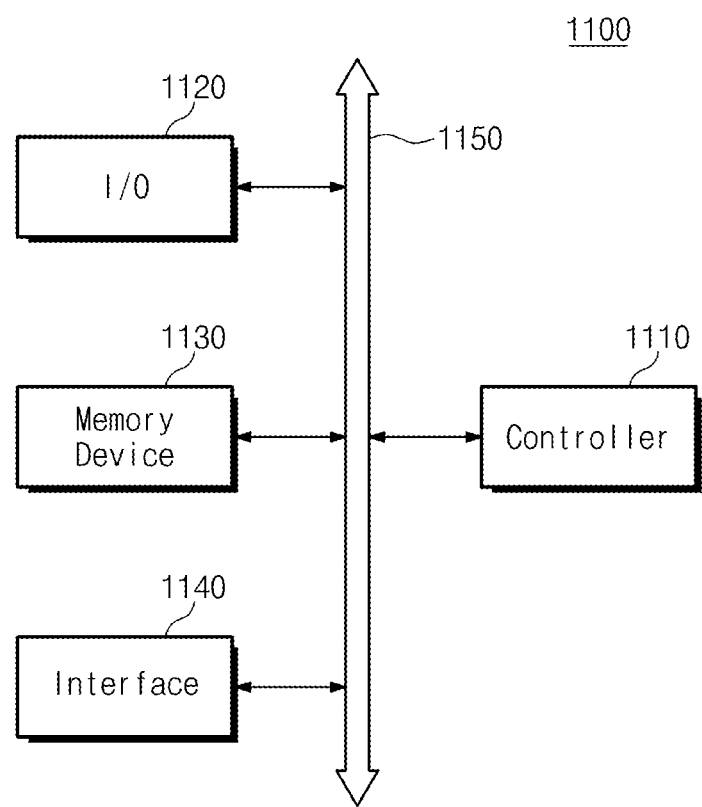
FIG. 21 is a schematic block diagram illustrating an example of electronic systems including semiconductor memory devices according to example embodiments of inventive concepts.

FIG. 21 is a schematic block diagram illustrating an example of electronic systems including semiconductor memory devices according to example embodiments of inventive concepts.

Referring to FIG. 21, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor memory devices according to the embodiments described above. The memory device 1130 may further include another type of semiconductor memory devices which are different from the semiconductor memory devices described in the aforementioned embodiments. For example, the memory device 1130 may further include a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 22:
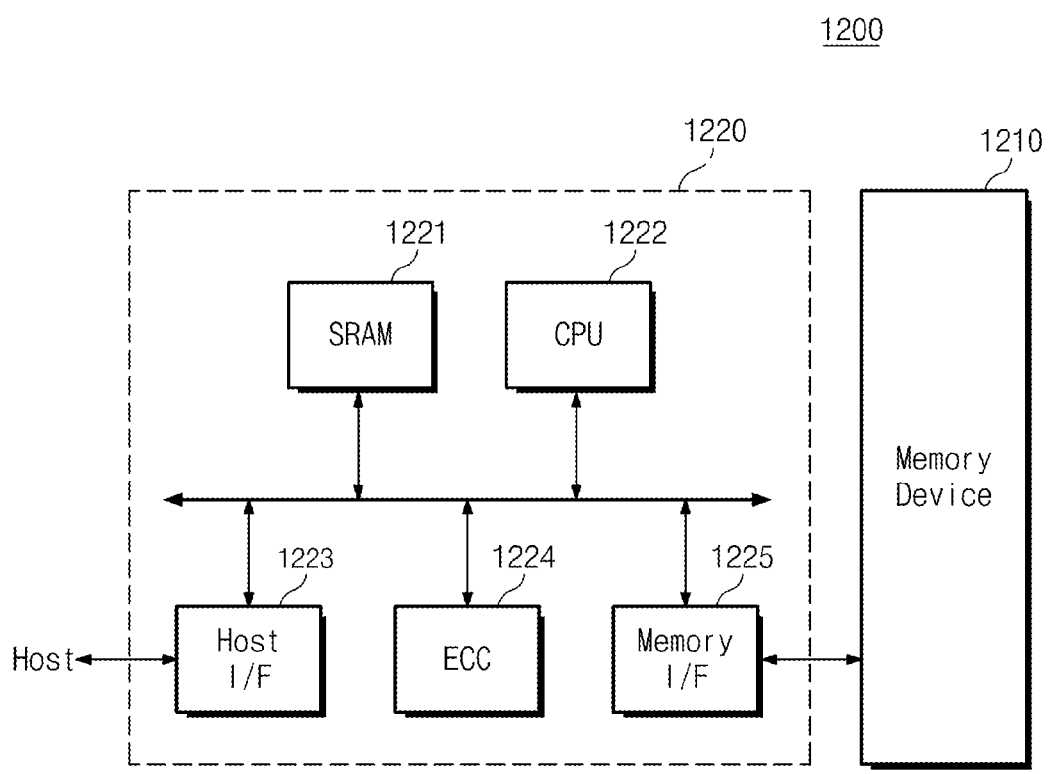
FIG. 22 is a schematic block diagram illustrating an example of memory cards including semiconductor memory devices according to example embodiments of inventive concepts.

FIG. 22 is a schematic block diagram illustrating an example of memory cards including semiconductor memory devices according to example embodiments of inventive concepts.

Referring to FIG. 22, a memory card 1200 according to an embodiment of the inventive concept may include a memory device 1210. The memory device 1210 may include at least one of the semiconductor memory devices according to the embodiments mentioned above. The memory device 1210 may further include another type of semiconductor memory devices which are different from the semiconductor memory devices according to the embodiments described above. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to example embodiments of inventive concepts, the interconnection patterns may be vertically stacked on the substrate. Each of the interconnection patterns includes the connection pad portion connecting the interconnection portions disposed at the same vertical height to each other, and the contact pad portion protruding the connection pad portion. The areas of the contact pad portions of the stacked interconnection patterns may be reduced from the lowermost interconnection pattern to the uppermost interconnection. Additionally, the contact pad portions are disposed at substantially the same distance from the cell array region. In other words, the contact pad portions may be arranged in the direction perpendicular to the long-axis direction of the interconnection portions. Thus, even though the stacked number of the interconnection patterns increases, it is possible to limit (and/or prevent) the increase of the area occupied by the stacked contact pad portions.

Additionally, the semiconductor memory device according to example embodiments of inventive concepts may include the vertical cell group selection parts and the memory block selection part. The vertical cell group selection parts may select one of the vertical cell groups including the first and second memory cells sharing the local bit lines, and the memory block selection part may select one of the memory blocks. Thus, it is possible to reduce a leakage current occurring through unselected memory cells of the three-dimensionally arranged memory cells. As a result, the integration degree and reliability of the semiconductor memory device may be improved together.

While some example embodiments have been particularly shown and described, it will be understood by one of ordinary skill in the art that variations in form and detail may be made therein without departing from the spirit and scope of the claims.

What is claimed is:

1. A semiconductor memory device comprising:
   a substrate;
   a plurality of memory blocks on the substrate, each of the plurality of memory blocks including
      a plurality of stack structures including a plurality of local bit lines stacked on the substrate,
      first vertical word lines crossing first sidewalls of the plurality of stack structures,
      second vertical word lines crossing second sidewalls of the plurality of stack structures,
      first variable resistive elements between the plurality of stack structures and the first vertical word lines, and
      second variable resistive elements between the plurality of stack structures and the second vertical word lines;
   global bit lines connected in common to the plurality of memory blocks;
   block selection lines configured to control electrical connection between the global bit lines and one of the plurality of memory blocks; and
   vertical selection lines on the substrate,
      the vertical selection lines configured to control electrical connection between the global bit lines and one of the plurality of stack structures.

2. The semiconductor memory device of claim 1, further comprising:
   a first horizontal word line crossing the plurality of local bit lines in one of the plurality of memory blocks,
      the first horizontal word line connected to at least two of the first vertical word lines that cross at least two of the first sidewalls of the plurality of stack structures in the one of the plurality of memory blocks; and
   a second horizontal word line crossing the plurality of local bit lines in the one of the plurality of memory blocks,
      the second horizontal word line connected to at least two of the second vertical word lines that cross at least two of the second sidewalls of the plurality of stack structures in the one of the plurality of memory blocks.

3. The semiconductor memory device of claim 1, wherein the vertical selection lines are electrically separated from each other, and
   the vertical selection lines cross over the first and second sidewalls of the plurality of stack structures.

4. The semiconductor memory device of claim 1, wherein the substrate includes a cell array region and a peripheral circuit region;
   each of the plurality of local bit lines includes
      a plurality of interconnection portions in the cell array region,
      a connection pad portion in the peripheral circuit region and horizontally connecting the interconnection portions to each other, and
      a contact pad portion horizontally protruding from the connection pad portion; and
      the contact pad portions of the plurality of local bit lines are at substantially a same horizontal distance from the cell array region.

5. The semiconductor memory device of claim 4,
   wherein the contact pad portions of the plurality of local bit lines have a stepped structure along a direction substantially perpendicular to a long-axis direction of the interconnection portions in a plan view; and
   the semiconductor memory device further includes:
   contact plugs connected to the contact pad portions of the plurality of local bit lines, respectively,
   the contact plugs being at substantially a same horizontal distance from the cell array region.

6. A semiconductor memory device comprising:
   a substrate,
      the substrate including a cell array region and a peripheral circuit region;
   a plurality of vertical cell groups on the cell array region of the substrate, each of the plurality of vertical cell groups including
      a plurality of local bit lines stacked on the substrate,
      first vertical word lines crossing first sidewalls of the plurality of local bit lines,
      second vertical word lines crossing second sidewalls of the plurality of local bit lines,
      first memory elements between the plurality of local bit lines and the first vertical word lines, and
      second memory elements between the plurality of local bit lines and the second vertical word lines;
   vertical cell group selection parts on the peripheral circuit region of the substrate,
      the vertical cell group selection parts connected to the plurality of vertical cell groups, respectively; and
   a memory block selection part on the peripheral circuit region of on the substrate of,
      the memory block selection part connected in common to the vertical cell group selection parts.

7. The semiconductor memory device of claim 6, wherein each one of the first vertical word lines are spaced apart in a diagonal direction from at least one of the second vertical word lines in a plan view.

8. The semiconductor memory device of claim 6, wherein each of the first and second vertical word lines have a width greater than a half of a distance between two of the plurality local bit lines that are horizontally adjacent to each other.

9. The semiconductor memory device of claim 6, further comprising:
   a first horizontal word line crossing the plurality of local bit lines,
      the first horizontal word line connected to at least two of the first vertical word lines from at least a different two of the plurality of vertical cell groups; and
   a second horizontal word line crossing the plurality of local bit lines,
      the second horizontal word line connected to at least two of the second vertical word lines from the at least a different two of the plurality of vertical cell groups.

10. The semiconductor memory device of claim 9, wherein a height of the first horizontal word line over the substrate is different than a height of the second horizontal word line over the substrate.

11. The semiconductor memory device of claim 9, wherein each one of the plurality of vertical cell groups includes a plurality of insulating layers between and electrically separating the plurality of stacked local bit lines respectively;

the plurality of stacked local bit lines of each one of the plurality of vertical cell groups constitute a local bit line structure of the vertical cell group that is on the cell array region of the substrate;

the first horizontal word line is between a bottom surface of the local bit line structure and the substrate; and the second horizontal word line is on a top surface of the local bit line structure.

12. The semiconductor memory device of claim 6, wherein the plurality of local bit lines extend from the cell array region into the peripheral circuit region; and each of the vertical cell group selection parts includes:
a plurality of selection transistors defined by portions of the local bit lines in the peripheral circuit region and vertical selection gate electrodes crossing over first and second sidewalls of the local bit lines in the peripheral circuit.

13. The semiconductor memory device of claim 6, wherein the plurality of local bit lines extend from the cell array region into the peripheral circuit region; and the memory block selection part includes:
a plurality of block selection transistors including a plurality of active regions defined at the substrate of the peripheral circuit region,
a block selection line crossing over the active regions,
first dopant regions in the active regions at a side of the block selection line and connected to the local bit lines, and
second dopant region in the active regions at an other side of the block selection line and connected to global bit lines.

14. The semiconductor memory device of claim 6, wherein the plurality of local bit lines extend from the cell array region into the peripheral circuit region; and the memory block selection part includes:
a plurality of block selection transistors including portions of the local bit lines in the peripheral circuit region, and
block selection lines crossing over first and second sidewalls of the local bit lines in the peripheral circuit region.

15. The semiconductor memory device of claim 6, wherein the plurality of local bit lines extend from the cell array region into the peripheral circuit region; and the plurality local bit lines at a same height from the substrate are horizontally connected to each other to constitute a connection pad portion on the substrate of the peripheral circuit region.

16. A semiconductor memory device comprising:
a substrate;
a plurality of memory blocks,
each one of the plurality of memory blocks including a memory block selection part connected to a plurality of vertical cell groups through a plurality of vertical cell group selection parts,
each one of the plurality of vertical cell groups including,
a plurality of local bit lines that are stacked on top of each other,
a plurality of first vertical word lines perpendicular to the substrate,
a plurality of second vertical word lines perpendicular to the substrate,
a plurality of first memory cells paired one-to-one with a plurality of second memory cells and arranged in rows and columns,
the plurality of first and second memory cells in a same row being electrically connected in common to one of the plurality of local bit lines that extends between the plurality of the first and second memory cells of the same row, and
the plurality of first and second memory cells in a same column arranged so one of the plurality of first vertical word lines is electrically connected to the plurality of first memory cells of the same column and one of the plurality of second vertical word lines is electrically connected to the plurality of second memory cells of the same column; and
a control circuit connected to the plurality of memory blocks,
the control circuit configured to select one of the plurality of first memory cells and the plurality of second memory cells independently in a selected one of the plurality of vertical cell groups of a selected one of the plurality of memory blocks.

17. The semiconductor memory device of claim 16, wherein each one of the plurality of first memory cells and each one of the plurality of second memory cells include a resistive memory element.

18. The semiconductor memory device of claim 16, wherein each one of the plurality of vertical cell groups further includes interlayer insulating layer between the plurality of local bit lines.

19. The semiconductor memory device of claim 16, wherein the control circuit is connected to
a block selection line decoder connected to memory block selection parts of the plurality of memory blocks through block selection lines,
a word line decoder connected to the plurality of first vertical word lines and the plurality of second vertical word lines of the plurality of memory blocks through first horizontal word lines and second horizontal word lines respectfully,
a vertical selection line decoder connected to the plurality of vertical cell group selection parts of the plurality of memory blocks through vertical selection lines,
a sense amplifier/page buffer connected to the plurality of memory blocks through a plurality of global bit lines; and
a bit line decoder connected to the sense amplifier/page buffer.

20. The semiconductor memory device of claim 16, wherein
each one of the plurality of vertical cell groups includes a data storage layer extending between first sidewalls of the plurality of local bit lines and the plurality of first vertical word lines,
the data storage layer extends between second sidewalls of the plurality of local bit lines and the plurality of second vertical word lines,
each one of the plurality of first memory cells is defined by a first sidewall portion of the data storage layer electrically connected between a portion of one of the plurality of first vertical word lines and a first sidewall portion of one of the plurality of local bit lines, and
each one of the plurality of second memory cells is defined by a second sidewall portion of the data storage layer electrically connected between a portion of one of the plurality of first vertical word lines and a second sidewall of one of the plurality of local bit lines.

* * * * *